United States Patent
Hatano

(10) Patent No.: US 11,721,612 B2
(45) Date of Patent: Aug. 8, 2023

(54) SEMICONDUCTOR DEVICE WITH CONNECTING MEMBER FOR ELECTRODE AND METHOD OF MANUFACTURING

(71) Applicant: ROHM CO., LTD., Kyoto (JP)

(72) Inventor: Maiko Hatano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 56 days.

(21) Appl. No.: 17/279,869

(22) PCT Filed: Sep. 25, 2019

(86) PCT No.: PCT/JP2019/037446
§ 371 (c)(1),
(2) Date: Mar. 25, 2021

(87) PCT Pub. No.: WO2020/071185
PCT Pub. Date: Apr. 9, 2020

(65) Prior Publication Data
US 2021/0398881 A1    Dec. 23, 2021

(30) Foreign Application Priority Data

Oct. 2, 2018  (JP) ................................ 2018-187528

(51) Int. Cl.
*H01L 23/492* (2006.01)
*H01L 23/31* (2006.01)
*H01L 23/00* (2006.01)

(52) U.S. Cl.
CPC ...... *H01L 23/4924* (2013.01); *H01L 23/3114* (2013.01); *H01L 24/83* (2013.01); *H01L 2224/8384* (2013.01)

(58) Field of Classification Search
CPC .................................................. H01L 23/4924
(Continued)

(56) References Cited

U.S. PATENT DOCUMENTS

2015/0214133 A1* 7/2015 Otremba ................. H01L 24/40
438/122
2018/0145007 A1  5/2018 Hatano et al.
(Continued)

FOREIGN PATENT DOCUMENTS

CN    103545268 A    1/2014
JP    2007-165690 A    6/2007
(Continued)

OTHER PUBLICATIONS

International Search Report issued in PCT/JP2019/037446, dated Dec. 17, 2019 (2 pages).
(Continued)

*Primary Examiner* — Ajay Arora
(74) *Attorney, Agent, or Firm* — Hamre, Schumann, Mueller & Larson, P.C.

(57) ABSTRACT

A semiconductor device A1 includes a semiconductor element 10A having an element obverse face 101 and an element reverse face 102, the element obverse face 101 having an obverse face electrode 11 formed thereon and the element reverse face 102 having a reverse face electrode 12 formed thereon, a conductive substrate 22A including an obverse face 221A opposed to the element reverse face 102, and to which the reverse face electrode 12 is conductively bonded, a conductive substrate 22B including an obverse face 221B and spaced from the conductive substrate 22A in a width direction x, and a lead member 51 extending in the width direction x, and electrically connecting the obverse face electrode 11 and the conductive substrate 22B. The lead member 51 is located ahead of the obverse face 221B in the direction in which the obverse face 221B is oriented, and bonded to the obverse face electrode 11 via a lead bonding layer 32. The conductive substrate 22A, the semiconductor element 10A, and the lead bonding layer 32 overlap with the conductive substrate 22B, as viewed in the width direction x.

20 Claims, 21 Drawing Sheets

(58) Field of Classification Search
USPC .......................................................... 257/735
See application file for complete search history.

(56) References Cited

U.S. PATENT DOCUMENTS

2018/0145020 A1  5/2018  Kohda et al.
2018/0350713 A1* 12/2018  Murai ................... H01L 23/367

FOREIGN PATENT DOCUMENTS

| JP | 2010-212729 A | 9/2010 |
| JP | 2016-219681 A | 12/2016 |
| WO | 2017/017901 A1 | 2/2017 |
| WO | 2017/130370 A1 | 8/2017 |

OTHER PUBLICATIONS

Office Action received in the corresponding Japanese Patent application, dated Mar. 14, 2023, and English translation (9 pages).
Office Action received in the corresponding Chinese Patent application, dated Apr. 28, 2023, and machine translation (15 pages).

* cited by examiner

FIG.2
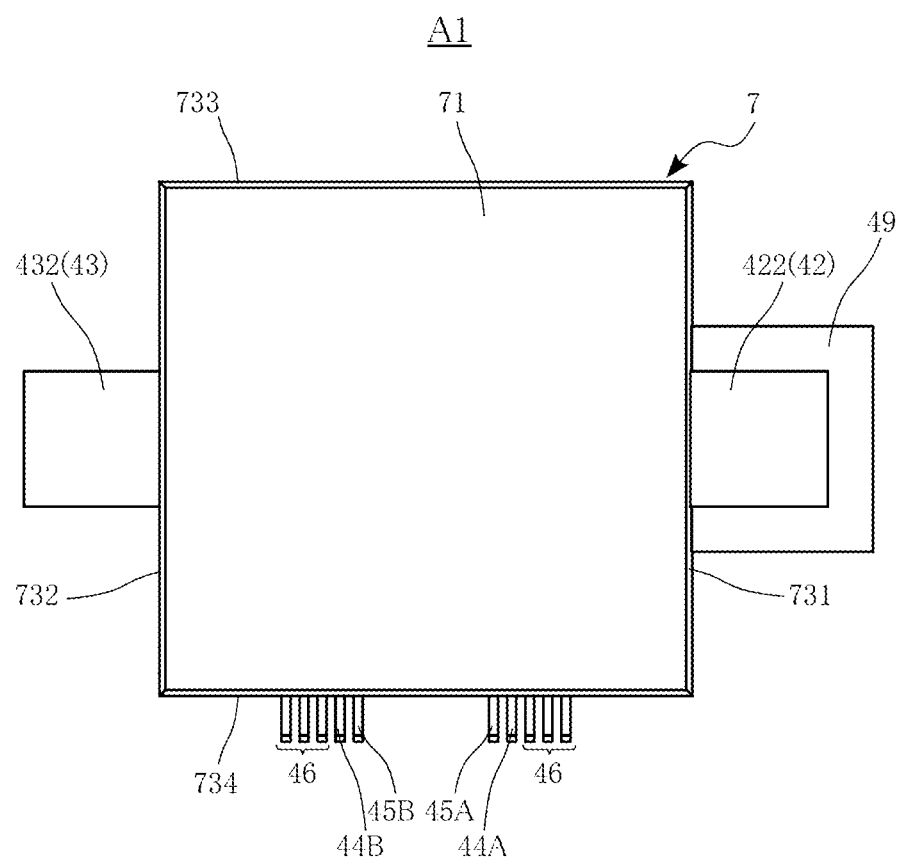
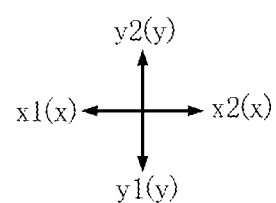

FIG.5
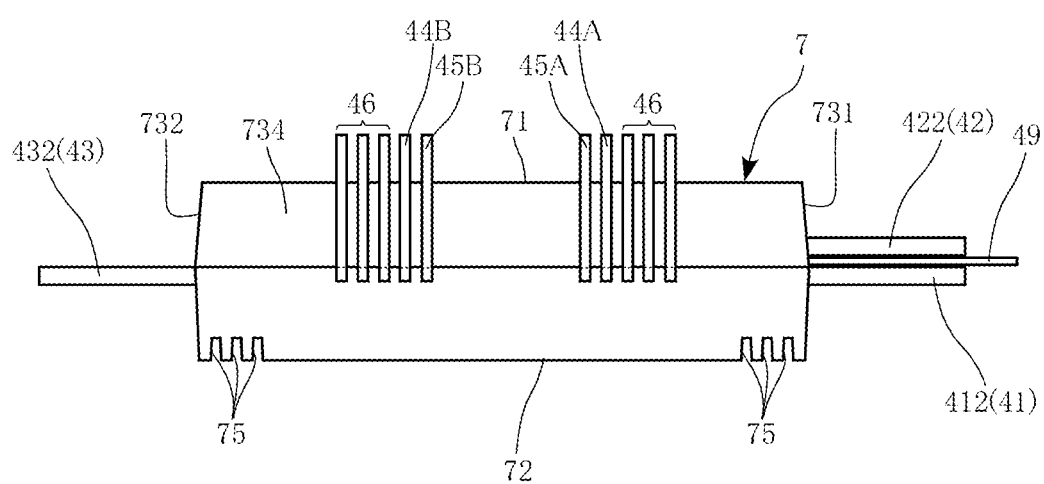
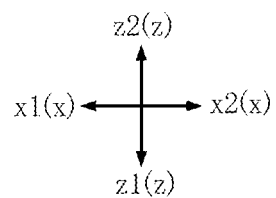

FIG.7
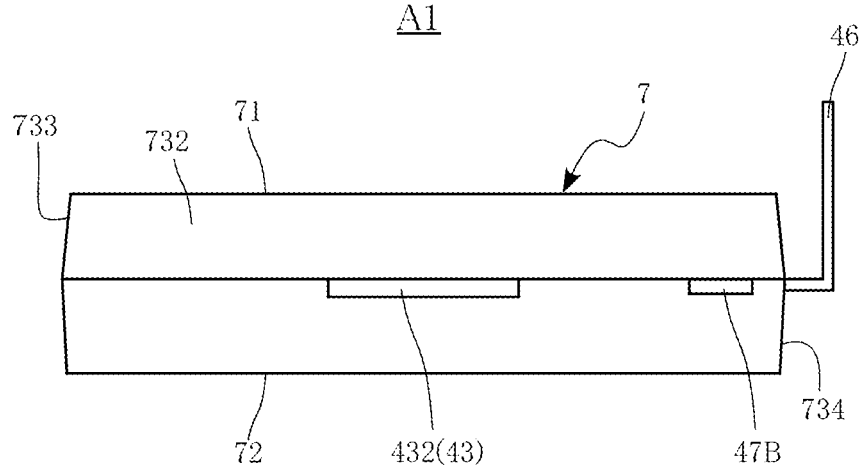
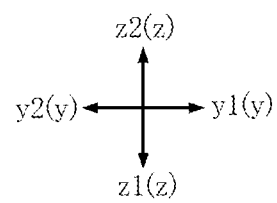
FIG.8
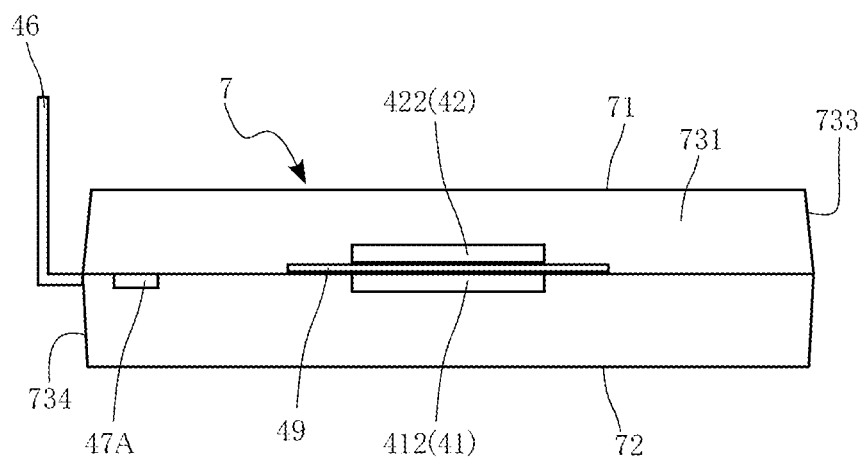
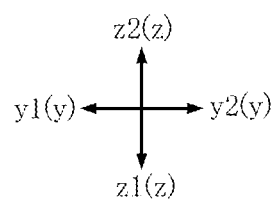

FIG.23
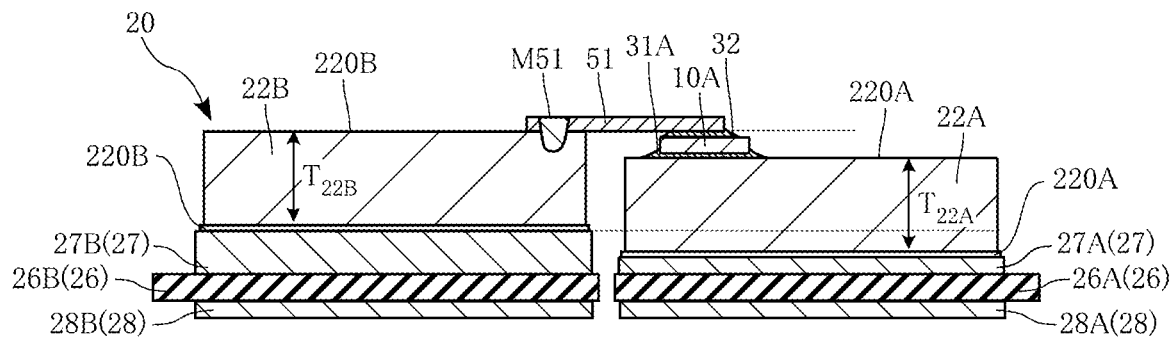
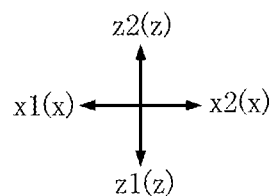
FIG.24
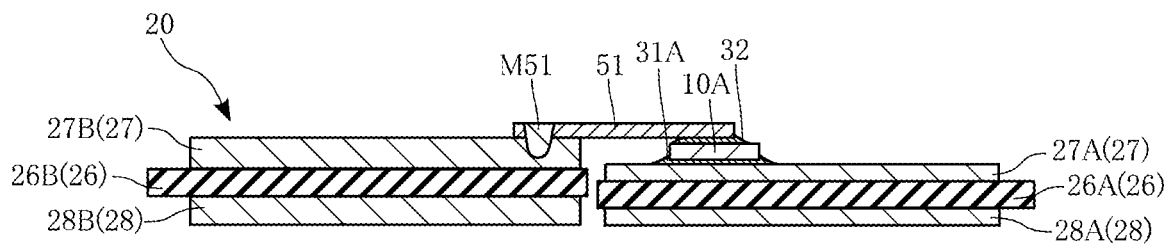
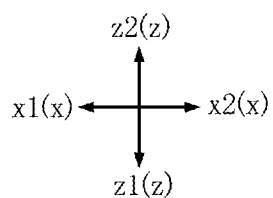

FIG.25
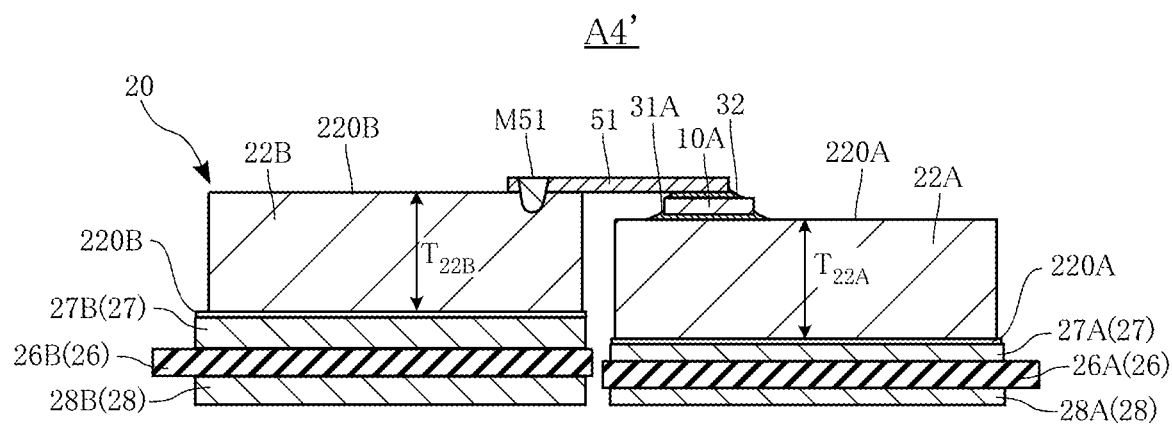
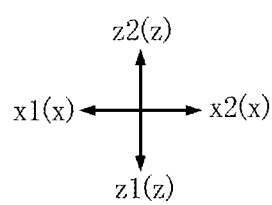
FIG.26
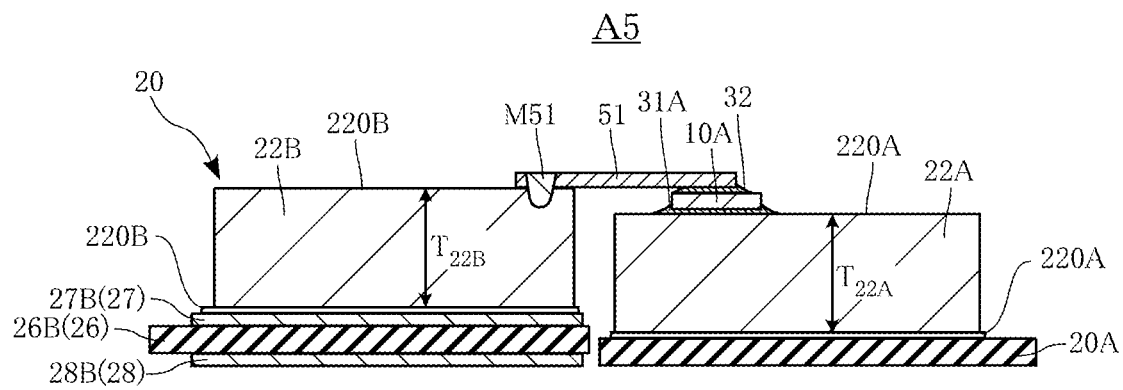
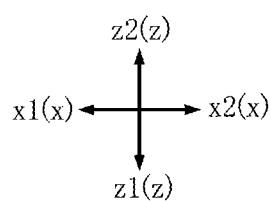

SEMICONDUCTOR DEVICE WITH CONNECTING MEMBER FOR ELECTRODE AND METHOD OF MANUFACTURING

TECHNICAL FIELD

The present disclosure relates to a semiconductor device and a manufacturing method thereof.

BACKGROUND ART

Various proposals regarding the configuration of a semiconductor device have been made so far. Patent Literature 1 discloses an example of the existing semiconductor devices. The semiconductor device disclosed in Patent Literature 1 includes a substrate, a first circuit layer, a second circuit layer, a semiconductor chip, and a beam lead. The substrate is formed of an insulative material. The first circuit layer and the second circuit layer are provided on the substrate, with a spacing between each other. The semiconductor chip is bonded on the first circuit layer. The beam lead is a metal plate connecting the upper face of the semiconductor chip and the upper face of the second circuit layer. The beam lead has one end connected to an electrode formed on the upper face of the semiconductor chip, via a sintered bonding material, and the other end connected to the second circuit layer via a sintered bonding material. Accordingly, the semiconductor chip and the second circuit layer are electrically connected to each other. The beam lead includes a chip-side bonding portion and a circuit-side bonding portion. The chip-side bonding portion is bonded to the semiconductor chip. The circuit-side bonding portion is bonded to the second circuit layer. These chip-side bonding portion and the circuit-side bonding portion are formed into a unified body, via two rising portion and a joint portion. The beam lead is bent between the chip-side bonding portion and the circuit-side bonding portion.

To bond the beam lead with the sintered bonding material, a paste material, which is the base material of the sintered bonding material, is heated and used as the sintered bonding material. When the beam lead is pressed by a pressing member, the pressing force is also applied to the paste material. Heating the paste material under pressure as noted above urges the silver particles contained in the paste material to combine with one another, thereby improving the bonding strength.

PRIOR ART DOCUMENT

Patent Document

Patent Document 1: JP-A-2016-219681

SUMMARY OF THE INVENTION

Problem to be Solved by the Invention

When the paste material is pressed to be formed into the sintered bonding material, the pressure has to be uniformly applied to the paste material. Otherwise, a lack of strength or breakdown of the sintered bonding material may be incurred. However, it is difficult to uniformly press a beam lead of a bent shape. For example, the shape of the beam lead may individually differ from each other, because of a manufacturing error in the bending process of the beam lead, which makes it difficult to uniformly press the beam lead. In addition, when the pressing force is unevenly applied to the beam lead, and concentrated to the semiconductor chip, the semiconductor chip may be broken. Therefore, the existing semiconductor devices may suffer degradation in reliability.

The present disclosure has been made in view of the foregoing situation, and an object thereof is to provide a semiconductor device configured to prevent degradation in reliability.

Means for Solving Problem

In a first aspect of the present disclosure, there is provided a semiconductor device including: a semiconductor element having an element obverse face and an element reverse face that face mutually oppositely in a first direction, where the element obverse face is formed with an obverse face electrode, and the element reverse face is formed with a reverse face electrode; a first electrode member including a first obverse face opposing the element reverse face and conductively bonded to the reverse face electrode; a second electrode member including a second obverse face facing in a same direction as the first obverse face and spaced from the first electrode member in a second direction orthogonal to the first direction; and a connecting member extending in the second direction and electrically connecting the obverse face electrode and the second electrode member. The connecting member is located offset from the second obverse face in the direction in which the second obverse face faces, and bonded to the obverse face electrode via a conductive bonding layer. The first electrode member, the semiconductor element and the conductive bonding layer overlap with the second electrode member, as viewed in the second direction.

In a second aspect of the present disclosure, there is provided a manufacturing method of a semiconductor device that comprises: a semiconductor element having an element obverse face and an element reverse face facing mutually oppositely in a first direction, where the element obverse face is formed with an obverse face electrode, the element reverse face being formed with a reverse face electrode; a first electrode member including a first obverse face facing in a same direction as the element obverse face; and a second electrode member including a second obverse face facing in the same direction as the first obverse face, the second electrode member being spaced apart from the first electrode member in a second direction orthogonal to the first direction. The manufacturing method comprises: mounting the semiconductor element on the first electrode member such that the element reverse face and the first obverse face oppose each other; electrically connecting the obverse face electrode and a connecting member via a conductive bonding layer; and bonding the connecting member to the second electrode member. The connecting member is located offset from the second obverse face in the direction in which the second obverse face faces. At least a part of the first electrode member, the semiconductor element and the conductive bonding layer overlap with the second electrode member as viewed in the second direction.

Advantages of the Invention

The semiconductor device according to the present disclosure, and the manufacturing method thereof, can prevent degradation in reliability of the semiconductor device.

BRIEF DESCRIPTION OF DRAWINGS

FIG. 2 is a plan view showing the semiconductor device according to the first embodiment.

FIG. 5 is a front view showing the semiconductor device according to the first embodiment.

FIG. 7 is a left side view showing the semiconductor device according to the first embodiment.

FIG. 8 is a right side view showing the semiconductor device according to the first embodiment.

FIG. 23 is a cross-sectional view showing an essential part of a semiconductor device according to a variation of the third embodiment.

FIG. 24 is a cross-sectional view showing an essential part of a semiconductor device according to a fourth embodiment.

FIG. 25 is a cross-sectional view showing an essential part of a semiconductor device according to a variation of the fourth embodiment.

FIG. 26 is a cross-sectional view showing an essential part of a semiconductor device according to a fifth embodiment.

MODE FOR CARRYING OUT THE INVENTION

Figure 1:
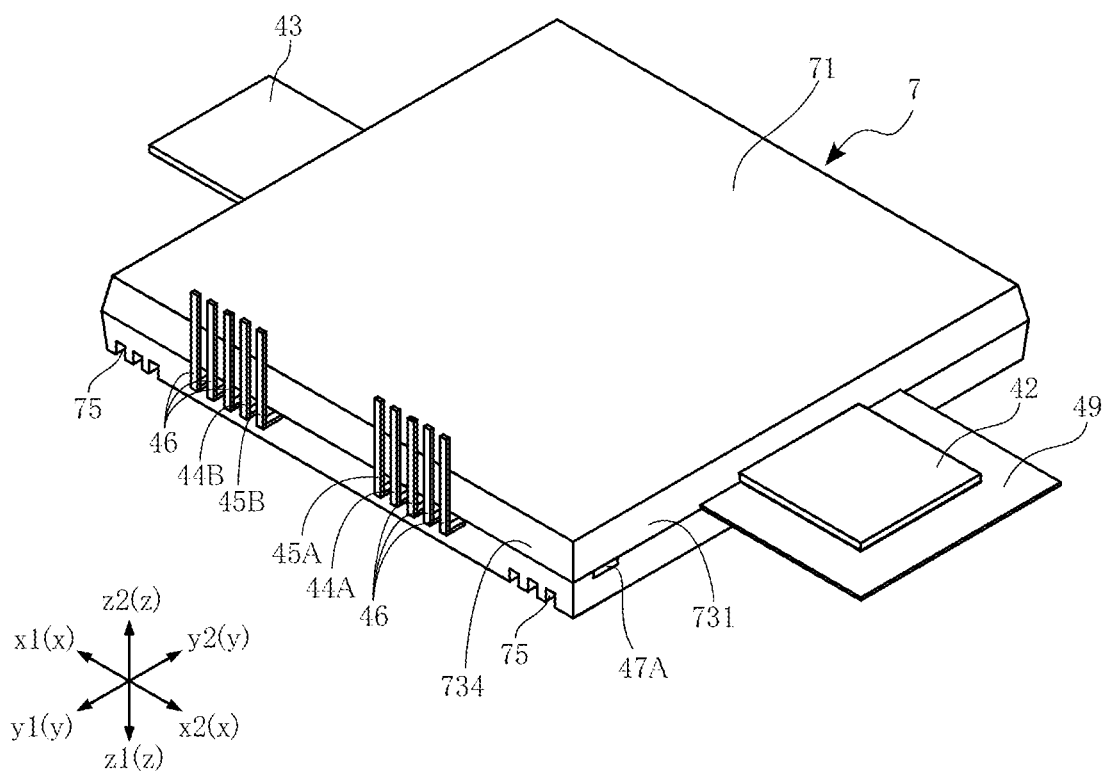
FIG. 1 is a perspective view showing a semiconductor device according to a first embodiment.

Semiconductor devices according to the present disclosure, and manufacturing methods of the semiconductor devices will be described below with reference to the drawings.

In the description of the present disclosure, the expression "An object A is formed in an object B", and "An object A is formed on an object B" imply the situation where, unless otherwise specifically noted, "the object A is formed directly in or on the object B", and "the object A is formed in or on the object B, with something else interposed between the object A and the object B". Likewise, the expression "An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Further, the expression "An object A is stacked in an object B", and "An object A is stacked on an object B" imply the situation where, unless otherwise specifically noted, "the object A is stacked directly in or on the object B", and "the object A is stacked in or on the object B, with something else interposed between the object A and the object B". Still further, the expression "An object A overlaps with an object B as viewed in a certain direction" implies the situation where, unless otherwise specifically noted, "the object A overlaps with the entirety of the object B", and "the object A overlaps with a part of the object B".

First Embodiment

FIG. 1 to FIG. 11 illustrate the semiconductor device according to a first embodiment of the present disclosure. The semiconductor device A1 according to the first embodiment includes a plurality of semiconductor elements 10, a support substrate 20, a plurality of conductive bonding layers 3, input terminals 41 and 42, an output terminal 43, a pair of gate terminals 44A and 44B, a pair of detection terminals 45A and 45B, a plurality of dummy terminals 46, a pair of side terminals 47A and 47B, a plurality of block electrodes 48, an insulation plate 49, a plurality of lead members 51, a plurality of wires 6, and a sealing resin 7. Hereinafter, the input terminals 41 and 42, the output terminal 43, the pair of gate terminals 44A and 44B, the pair of detection terminals 45A and 45B, the plurality of dummy terminals 46, and the pair of side terminals 47A and 47B may be collectively referred to as "terminal 40", where appropriate.

Figure 3:
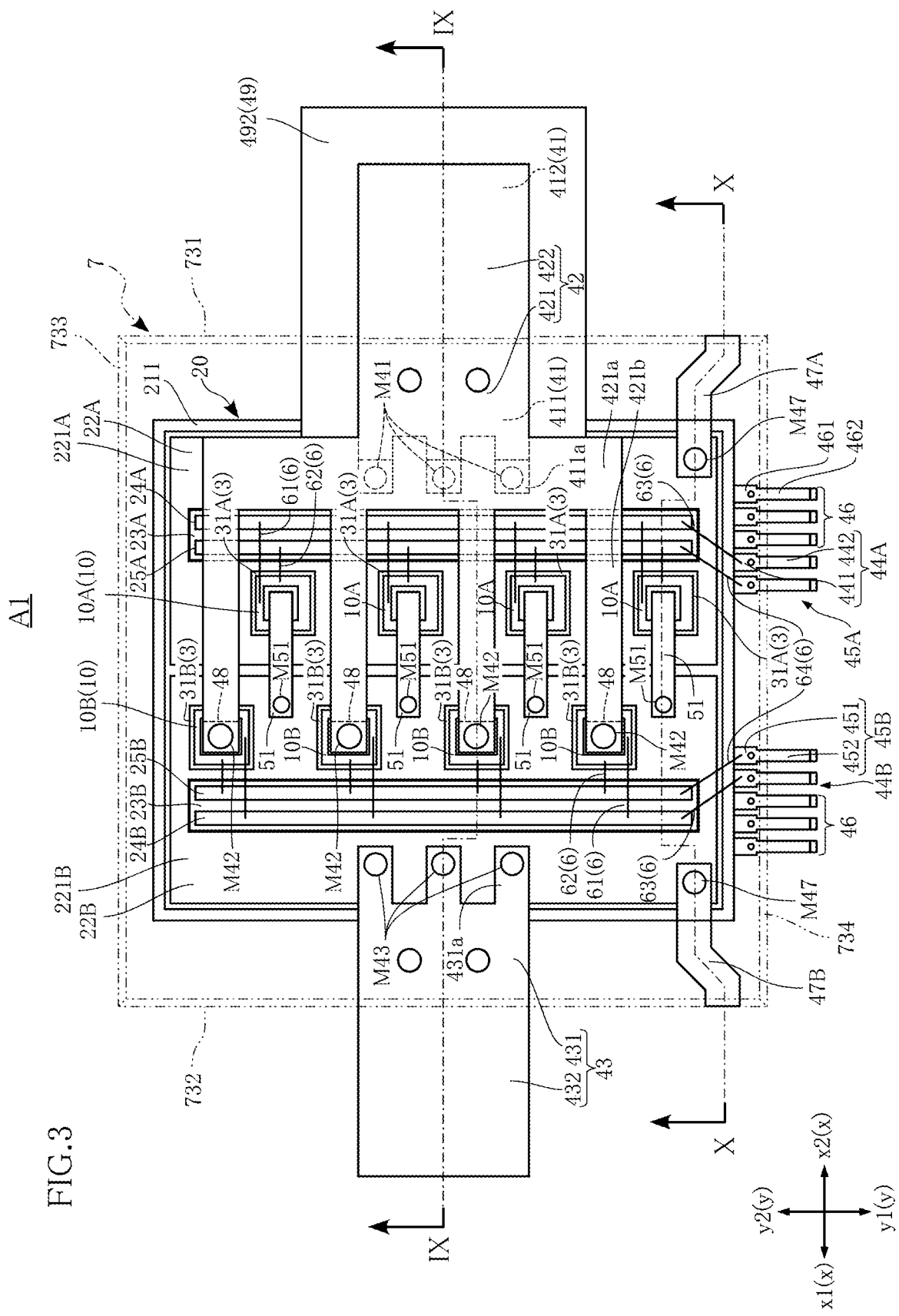
FIG. 3 is a plan view of the semiconductor device shown in FIG. 2, seen through a sealing resin.
Figure 4:
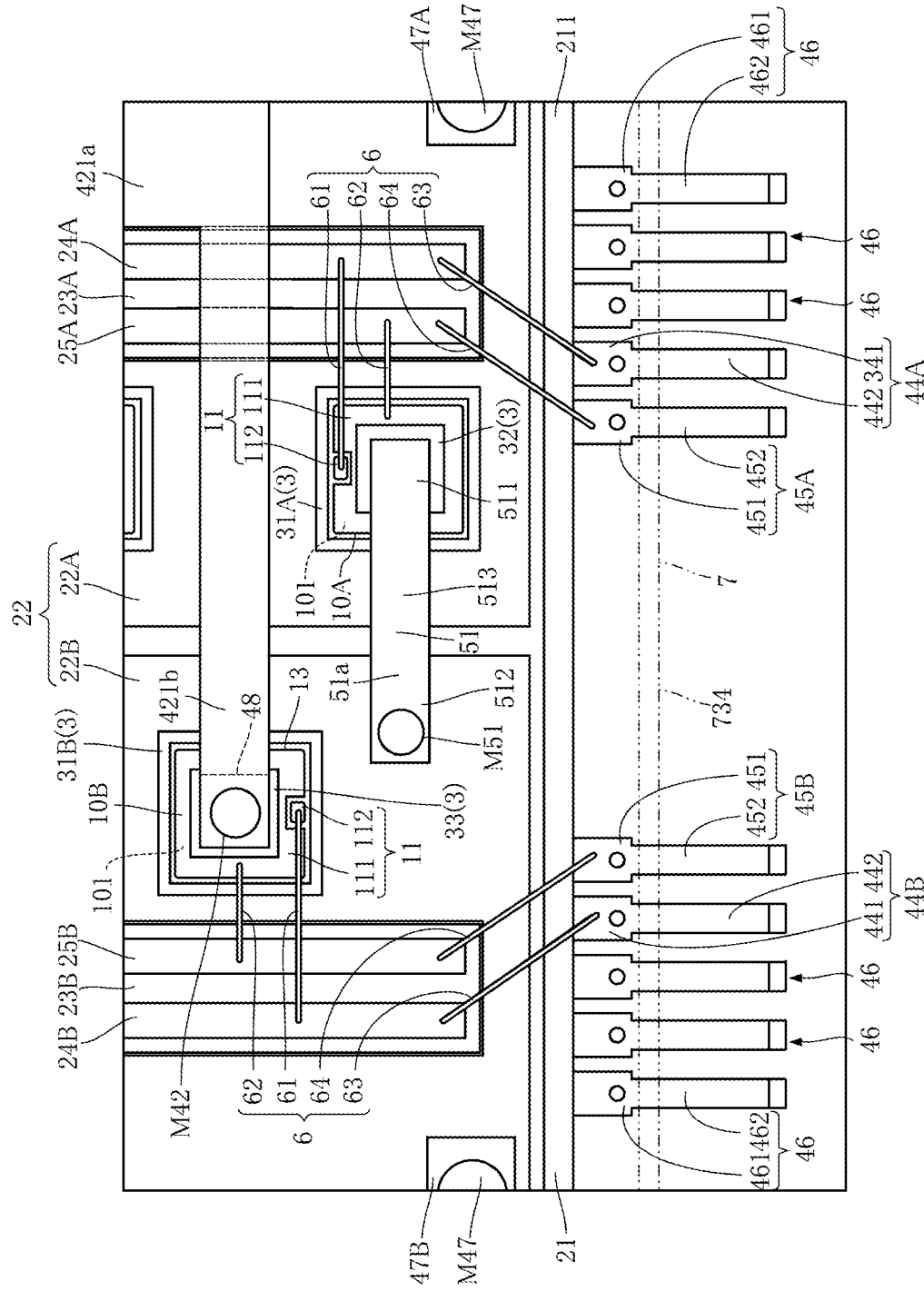
FIG. 4 is a partially enlarged plan view from FIG. 3.
Figure 6:
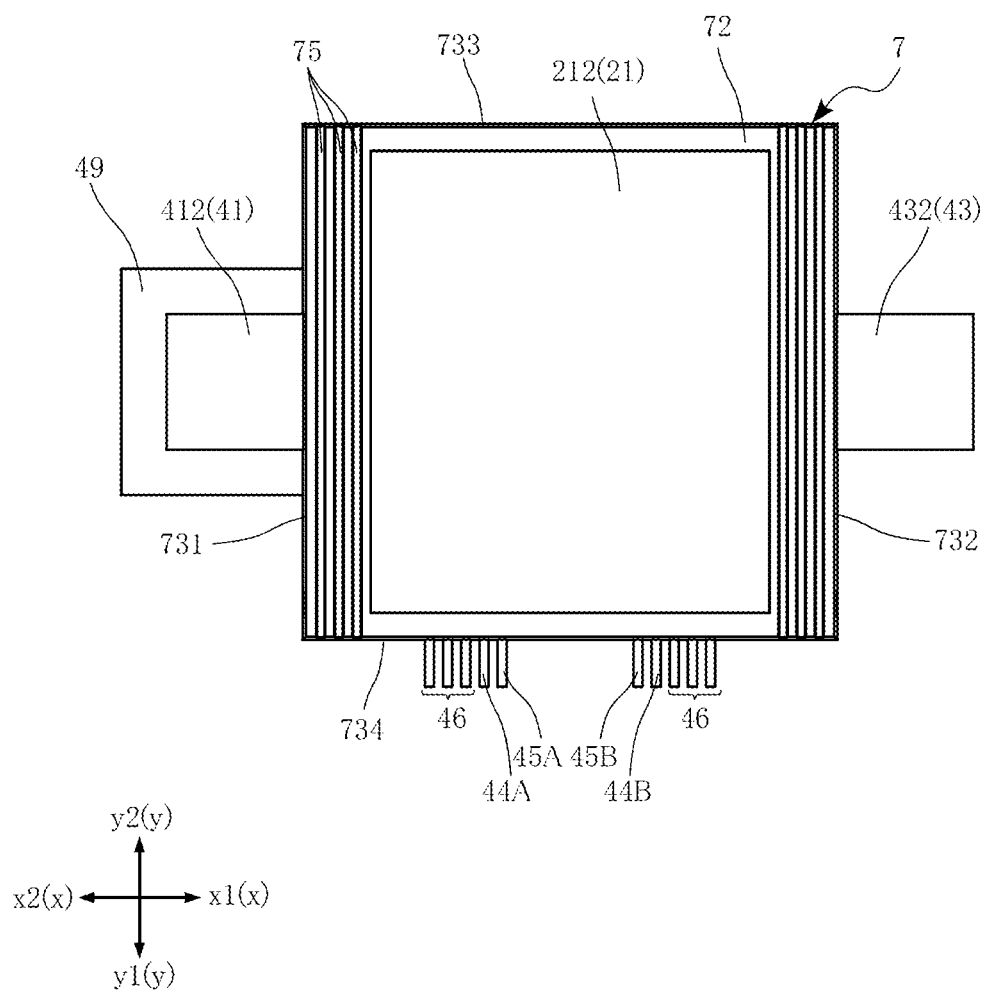
FIG. 6 is a bottom view showing the semiconductor device according to the first embodiment.

FIG. 1 is a perspective view showing the semiconductor device A1. FIG. 2 is a plan view showing the semiconductor device A1. FIG. 3 is the same plan view as FIG. 2, but seen through the sealing resin 7. In FIG. 3, the sealing resin 7 is indicated by imaginary lines (dash-dot-dot lines). FIG. 4 is a partially enlarged plan view from FIG. 3. FIG. 5 is a front view showing the semiconductor device A1. FIG. 6 is a bottom view showing the semiconductor device A1. FIG. 7 is a left side view showing the semiconductor device A1.

Figure 9:
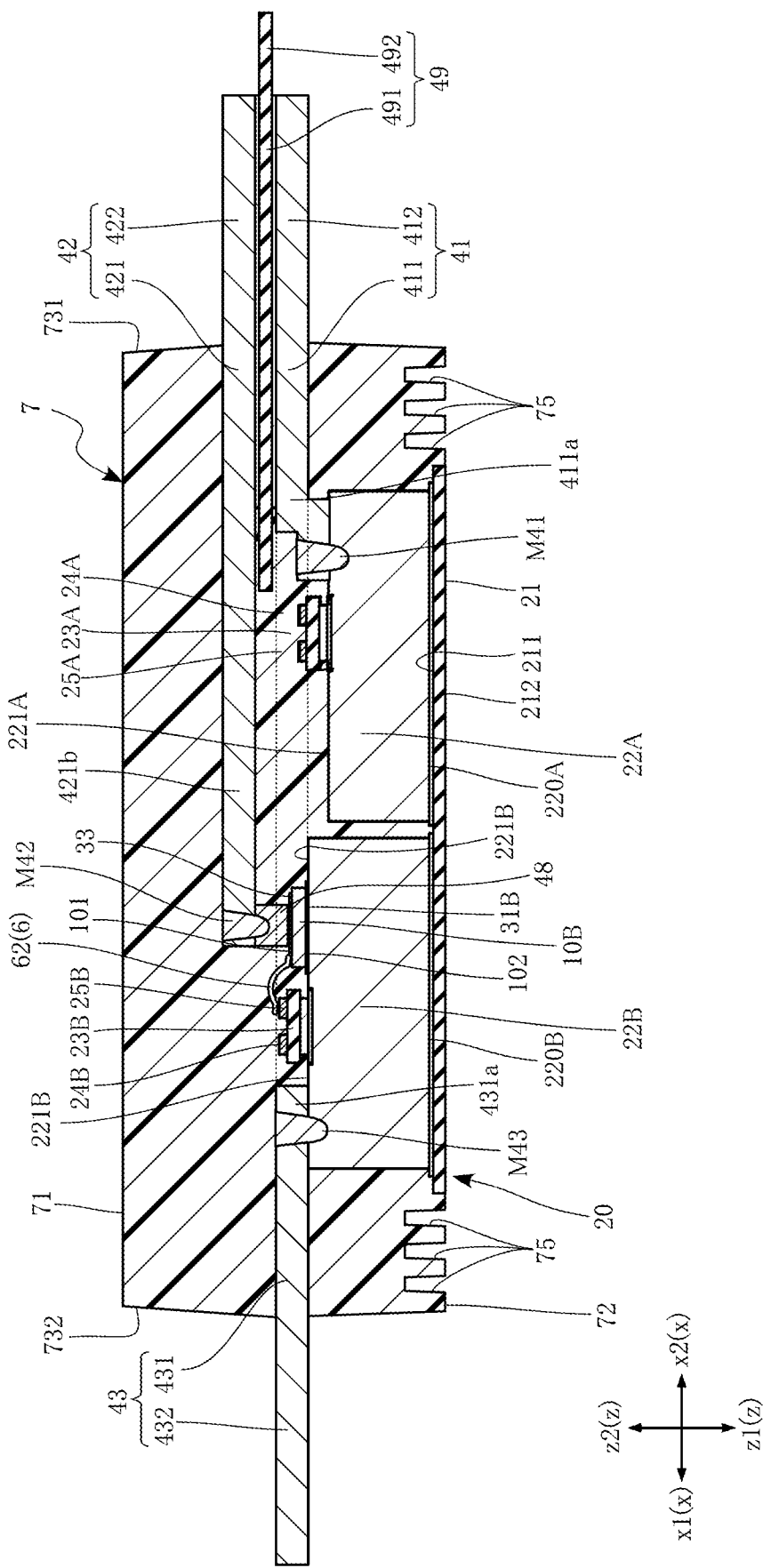
FIG. 9 is a cross-sectional view taken along a line IX-IX in FIG. 3.
Figure 10:
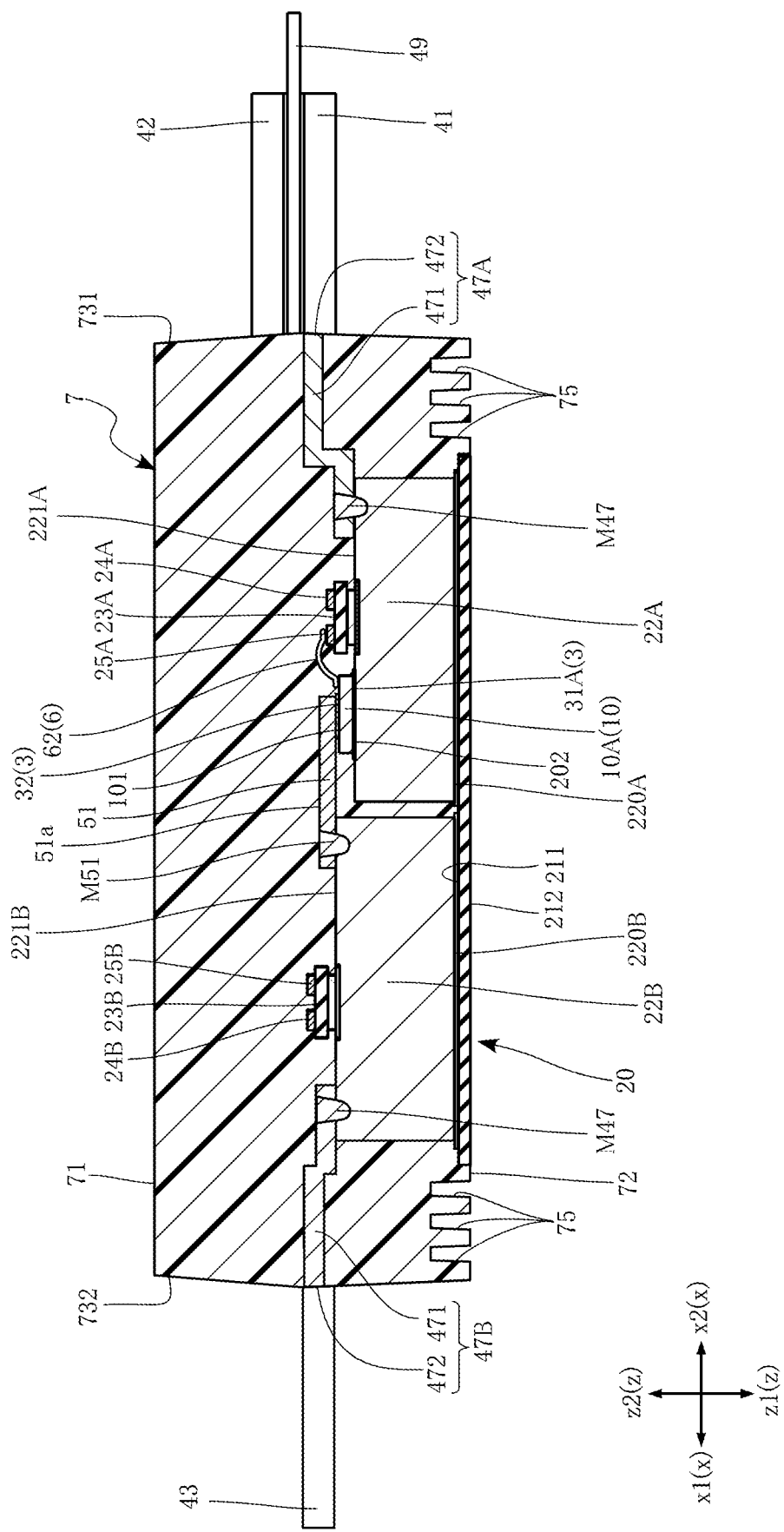
FIG. 10 is a cross-sectional view taken along a line X-X in FIG. 3.
Figure 11:
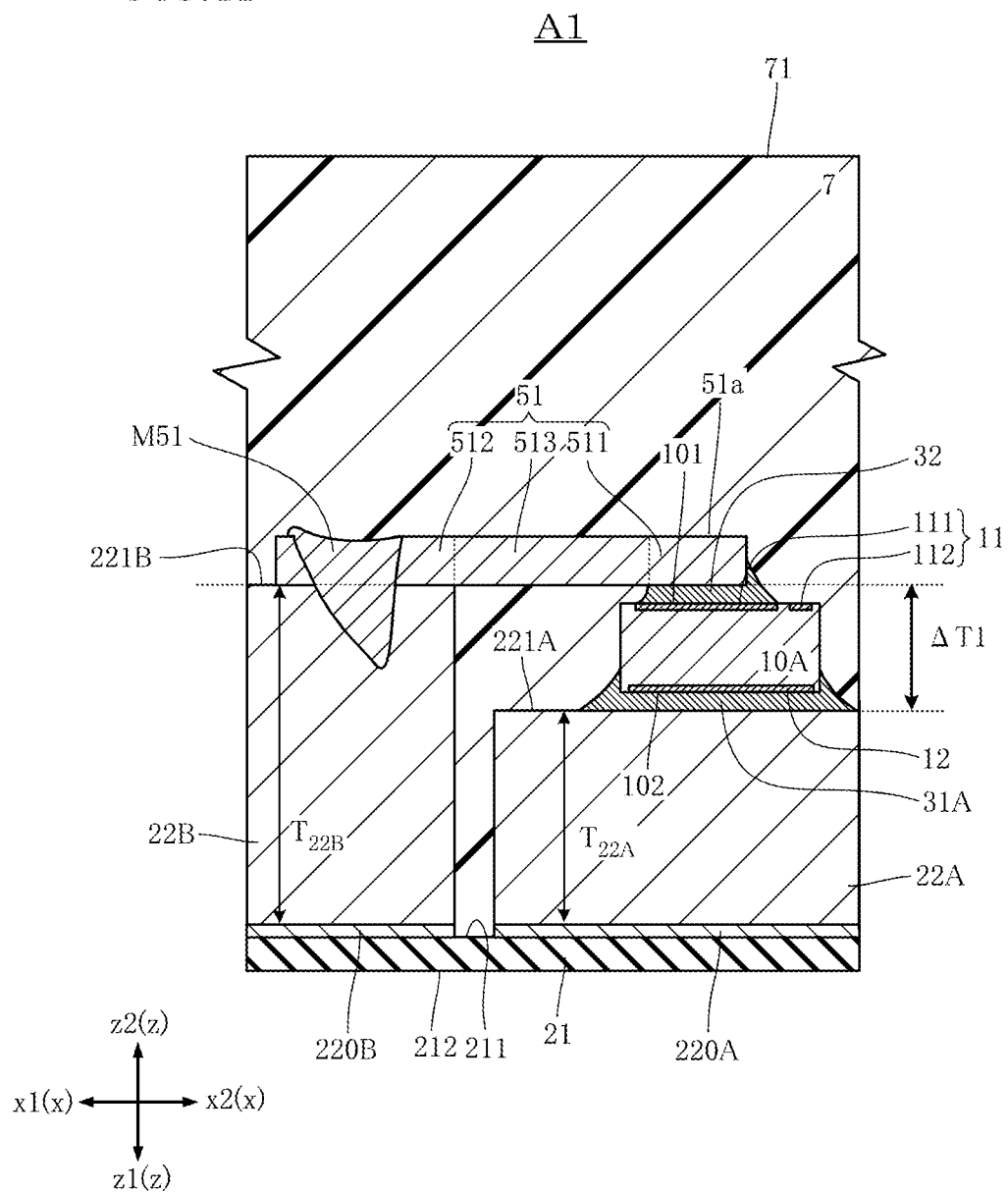
FIG. 11 is a partially enlarged cross-sectional view from FIG. 10.
Figure 12:
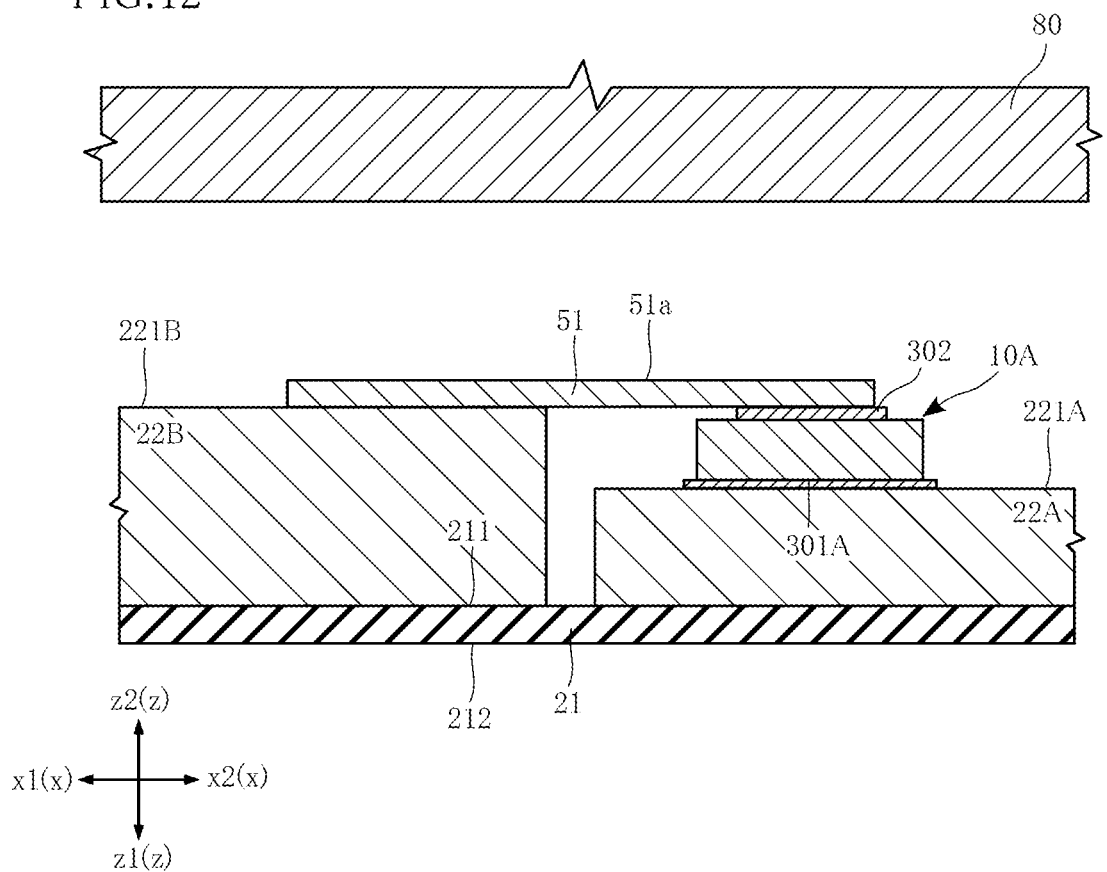
FIG. 12 is a cross-sectional view for explaining a first press-heating process, in a manufacturing method of the semiconductor device according to the first embodiment.

FIG. 8 is a right side view showing the semiconductor device A1. FIG. 9 is a cross-sectional view taken along a line IX-IX in FIG. 3. FIG. 10 is a cross-sectional view taken along a line X-X in FIG. 3. FIG. 11 is a partially enlarged cross-sectional view from FIG. 10. In FIG. 11, the wires 6 are not shown.

For the sake of convenience in description, three directions orthogonal to one another will be defined as a width direction x, a depth direction y, and a thickness direction z, in FIG. 1 to FIG. 11. The width direction x corresponds to the left-right direction in the plan view of the semiconductor device A1 (see FIG. 2 and FIG. 3). The depth direction y corresponds to the up-down direction in the plan view of the semiconductor device A1 (see FIG. 2 and FIG. 3). In addition, one side in the width direction x may be expressed as x1-side in the width direction, and the other side in the width direction x may be expressed as x2-side in the width direction, when necessary. Likewise, one side in the depth direction y may be expressed as y1-side in the depth direction, and the other side in the depth direction y may be expressed as y2-side in the depth direction, one side in the thickness direction z may be expressed as z1-side in the thickness direction, and the other side in the thickness direction z may be expressed as z2-side in the thickness direction. The direction toward the z1-side in the thickness direction may be expressed as downward, and the direction toward the z2-side in the thickness direction may be expressed as upward. Further, a size in the thickness direction z may be expressed as "thickness". The thickness direction z corresponds to the "first direction" in the present disclosure. In this embodiment, the width direction x corresponds to the "second direction" in the present disclosure.

The plurality of semiconductor elements 10 are each formed of a semiconductor material predominantly composed of silicon carbide (SiC). However, the semiconductor material is not limited to SiC, but may be silicon (Si), gallium arsenide (GaAs), or gallium nitride (GaN). In this embodiment, the semiconductor elements 10 are exemplified by metal-oxide-semiconductor field-effect transistors (MOSFET). However, the plurality of semiconductor elements 10 are not limited to the MOSFET, but may each be a field-effect transistors such as a metal-insulator-semiconductor FET (MISFET), a bipolar transistor such as an insulated gate bipolar transistor (IGBT), an IC chip such as an LSI, a diode, a capacitor, or the like. In this embodiment, all the semiconductor elements 10 are the same, and formed as an n-channel type MOSFET. The semiconductor elements 10 each have, without limitation thereto, a rectangular shape, as viewed in the thickness direction z (hereinafter, may also be expressed as "in a plan view"). The thickness of the semiconductor elements 10 is approximately 50 to 370 μm, but not limited thereto.

The plurality of semiconductor elements 10 each include, as shown in FIG. 11, an element obverse face 101 and an element reverse face 102. Although only the semiconductor element 10A is illustrated in FIG. 11, the semiconductor element 10B is also configured in the same way. In each of the semiconductor elements 10, the element obverse face 101 and the element reverse face 102 are spaced from each other in the thickness direction z, and oriented in the opposite directions. In this embodiment, the element obverse face 101 faces to the z2-side in the thickness direction, and the element reverse face 102 faces to the z1-side in the thickness direction.

The plurality of semiconductor elements 10 each include, as shown in FIG. 11, an obverse face electrode 11, a reverse face electrode 12, and an insulation film 13.

The obverse face electrode 11 is provided on the element obverse face 101. The obverse face electrode 11 includes a first electrode 111 and a second electrode 112, as shown in FIG. 4 and FIG. 11. In this embodiment, the first electrode 111 is a source electrode, through which a source current flows. In this embodiment, the second electrode 112 is a gate electrode, to which a gate voltage for driving the semiconductor element 10 is applied. The first electrode 111 is larger than the second electrode 112. Here, although the is formed in a single region in this embodiment, the first electrode 111 may be divided into a plurality of regions.

The reverse face electrode 12 is provided on the element reverse face 102. In this embodiment, the reverse face electrode 12 is formed over the entirety of the element reverse face 102. In this embodiment, the reverse face electrode 12 is a drain electrode, through which a drain current flows.

The insulation film 13 is provided on the element obverse face 101, as shown in FIG. 4. The insulation film 13 is electrically insulative. The insulation film 13 is formed so as to surround the obverse face electrode 11, in a plan view. The insulation film 13 insulates between the first electrode 111 and the second electrode 112. The insulation film 13 is, for example, composed of a silicon dioxide ($SiO_2$) layer, a silicon nitride ($SiN_4$) layer, and a polybenzoxazole layer, stacked in this order from the element obverse face 101. The polybenzoxazole layer in the insulation film 13 may be substituted with a polyimide layer. The structure of the insulation film 13 is not limited to the above.

The plurality of semiconductor elements 10 include a plurality of semiconductor elements 10A and a plurality of semiconductor elements 10B. In this embodiment, the semiconductor device A1 constitutes a half-bridge switching circuit. The plurality of semiconductor elements 10A constitute the upper arm circuit in the switching circuit, and the plurality of semiconductor elements 10B constitute the lower arm circuit in the switching circuit. As shown in FIG. 3, the semiconductor device A1 includes four semiconductor elements 10A and four semiconductor elements 10B. However, the number of the semiconductor elements 10 may be modified as desired according to the required performance level of the semiconductor device A1, without limitation to the above.

The plurality of semiconductor elements 10A are each mounted on a support substrate 20 (conductive substrate 22A to be subsequently described), as shown in FIG. 3, FIG. 4, FIG. 10, and FIG. 11. In this embodiment, the plurality of semiconductor elements 10A are aligned in the depth direction y, with a spacing between each other. The semiconductor elements 10A are each mounted on the conductive substrate 22A, with the element reverse face 102 opposed to the conductive substrate 22A. The semiconductor elements 10A are, as shown in FIG. 3, FIG. 4, FIG. 10, and FIG. 11, each conductively bonded to the support substrate 20 (conductive substrate 22A), via a conductive bonding layer 3 (element bonding layer 31A to be subsequently described). All the semiconductor elements 10A overlap with the conductive substrate 22B, as viewed in the width direction x.

The plurality of semiconductor elements 10B are each mounted on a support substrate 20 (conductive substrate 22B to be subsequently described), as shown in FIG. 3, FIG. 4, and FIG. 9. In this embodiment, the plurality of semiconductor elements 10B are aligned in the depth direction y, with a spacing between each other. The semiconductor elements 10B are each mounted on the conductive substrate 22B, with the element reverse face 102 opposed to the conductive substrate 22B. The semiconductor elements 10B are, as shown in FIG. 3, FIG. 4, and FIG. 9, each conductively bonded to the support substrate 20 (conductive substrate 22B), via a conductive bonding layer 3 (element bonding layer 31B to be subsequently described). Although the plurality of semiconductor elements 10A and the plurality of semiconductor elements 10B are alternately arranged, as viewed in the width direction x in this embodiment, the plurality of semiconductor elements 10A and the plurality of semiconductor elements 10B may be arranged so as to overlap, as viewed in the width direction x.

The support substrate 20 serves to support the plurality of semiconductor elements 10. The support substrate 20 includes an insulation substrate 21, a plurality of conductive substrates 22, a pair of insulation layers 23A and 23B, a pair of gate layers 24A and 24B, and a pair of detection layers 25A and 25B.

On the insulation substrate 21, the plurality of conductive substrates 22 are mounted, as shown in FIG. 9 and FIG. 10. The insulation substrate 21 is electrically insulative. The insulation substrate 21 may be formed of, for example, a highly heat-conductive ceramic. Examples of such ceramic include aluminum nitride (AlN), silicon nitride (SiN), and aluminum oxide ($Al_2O_3$). In this embodiment, the insulation substrate 21 has a rectangular shape in a plan view, as shown in FIG. 3. In addition, the insulation substrate 21 is formed in a single plate shape. In this embodiment, the insulation substrate 21 corresponds to the "insulation member" in the present disclosure.

The insulation substrate 21 includes an obverse face 211 and a reverse face 212, as shown in FIG. 9 and FIG. 10. The obverse face 211 and the reverse face 212 are spaced from each other in the thickness direction z, and oriented in opposite directions. The obverse face 211 faces to the side on which the plurality of conductive substrates 22 are mounted, in other words facing to the z2-side in the thickness direction. The obverse face 211 is covered with the sealing resin 7, together with the plurality of conductive substrates 22 and the plurality of semiconductor elements 10. The reverse face 212 faces to the z1-side in the thickness direction. The reverse face 212 is exposed from the sealing resin 7, as shown in FIG. 6, FIG. 9, and FIG. 10. To the reverse face 212, for example a non-illustrated heatsink may be connected. Here, the insulation substrate 21 may be individually provided for each of the plurality of conductive substrates 22, without limitation to the above. In this embodiment, the obverse face 211 corresponds to the "insulation member obverse face" in the present disclosure.

The plurality of conductive substrates 22 are each formed of a conductive plate-shape material. The conductive substrates are each formed of copper, or a copper-based alloy. Accordingly, the conductive substrates 22 are copper substrates. Alternatively, the conductive substrates 22 may each be formed as a composite substrate, composed of a graphite substrate and a copper material provided on both sides of the graphite substrate in the thickness direction z. Further, the surface of each of the conductive substrates 22 may be plated with silver. The plurality of conductive substrates 22 each constitute an electrical conduction path to the corresponding semiconductor elements 10, in collaboration with the plurality of terminals 40. The plurality of conductive substrates 22 are spaced from each other, and each located on the obverse face 211 of the insulation substrate 21.

The plurality of conductive substrates 22 include a conductive substrate 22A and a conductive substrate 22B. In this embodiment, the conductive substrates 22A and 22B are aligned on the insulation substrate 21 in the width direction x, with a spacing therebetween, as shown in FIG. 3, FIG. 9, FIG. 10, and FIG. 11. The conductive substrates 22A and 22B both have a rectangular shape in a plan view, as shown in FIG. 3.

The conductive substrate 22A is bonded on the obverse face 211 of the insulation substrate 21 via a bonding material 220A, as shown in FIG. 9, FIG. 10, and FIG. 11. Here, the bonding material 220A may be formed of a conductive material such as silver paste, solder, or a sintered metal, or an insulative material. The conductive substrate 22A is located on the x2-side in the width direction, with respect to the conductive substrate 22B, as shown in FIG. 3, FIG. 9, FIG. 10, and FIG. 11. The conductive substrate 22A includes, as shown in FIG. 9, FIG. 10, and FIG. 11, an obverse face 221A facing to the z2-side in the thickness direction, and the plurality of semiconductor elements 10A are mounted on the obverse face 221A. The conductive substrate 22A overlaps, in its entirety, with the conductive substrate 22B as viewed in the width direction x. A size $T_{22A}$ of the conductive substrate 22A in the thickness direction z is approximately 0.4 to 3.0 mm. In this embodiment, the conductive substrate 22A corresponds to the "first electrode member" and the "first conductive substrate" in the present disclosure. In addition, the obverse face 221A corresponds to the "first obverse face" in the present disclosure, and the bonding material 220A corresponds to the "first bonding material" in the present disclosure.

The conductive substrate 22B is bonded on the obverse face 211 of the insulation substrate 21 via a bonding material 220B, as shown in FIG. 9, FIG. 10, and FIG. 11. Here, the bonding material 220B may be formed of a conductive material such as silver paste, solder, or a sintered metal, or an insulative material. The conductive substrate 22B includes, as shown in FIG. 9, FIG. 10, and FIG. 11, an obverse face 221B facing to the z2-side in the thickness direction, and the plurality of semiconductor elements 10B are mounted on the obverse face 221B. In addition, one end of each of the plurality of lead members 51 is bonded to the obverse face 221B. A size $T_{22B}$ of the conductive substrate 22B in the thickness direction z is approximately 0.4 to 3.0 mm. In this embodiment, the conductive substrate 22B corresponds to the "second electrode member" and the "second conductive substrate" in the present disclosure. In addition, the obverse face 221B corresponds to the "second obverse face" in the present disclosure, and the bonding material 220B corresponds to the "second bonding material" in the present disclosure.

In this embodiment, the obverse face 221A of the conductive substrate 22A and the obverse face 221B of the conductive substrate 22B are deviated from each other in the thickness direction z, as shown in FIG. 11. Accordingly, a level difference is created in the thickness direction z, on the support substrate 20. In this embodiment, a distance $\Delta T1$ (see FIG. 11) between the obverse face 221A and the obverse face 221B in the thickness direction z is approximately 100 to 500 μm. In this embodiment, the distance $\Delta T1$ is determined by adjusting the size of the conductive substrate 22A and the conductive substrate 22B in the thickness direction z. In other words, the difference between the size $T_{22A}$ of the conductive substrate 22A in the thickness direction z, and the size $T_{22B}$ of the conductive substrate 22B in the thickness direction z is approximately 100 to 500 μm. From another viewpoint, the distance $\Delta T1$ corresponds to the total sum of the size of the semiconductor elements 10 in the thickness direction z, the size of the element bonding layer 31A in the thickness direction z, and the size of the lead bonding layer 32 in the thickness direction z. Accordingly, when the semiconductor element 10 is thicker, the distance ΔT1 is increased, and when the semiconductor element 10 is thinner, the distance ΔT1 is reduced. Regarding the element bonding layer 31A and the lead bonding layer 32 also, the distance ΔT1 may be adjusted according to the thickness of those layers.

The pair of insulation layers 23A and 23B, which are electrically insulative, are formed of a glass epoxy resin, for example. The pair of insulation layers 23A and 23B each have a belt-like shape extending in the depth direction y, as shown in FIG. 3. The insulation layer 23A is bonded to the obverse face 221A of the conductive substrate 22A, as shown in FIG. 3, FIG. 9, and FIG. 10. The insulation layer 23A is located on the x2-side in the width direction, with respect to the plurality of semiconductor elements 10A. The insulation layer 23B is bonded to the obverse face 221B of the conductive substrate 22B, as shown in FIG. 3, FIG. 9, and FIG. 10. The insulation layer 23B is located on the x1-side in the width direction, with respect to the semiconductor element 10B.

The pair of gate layers 24A and 24B, which are electrically insulative, are formed of copper, or a copper-based alloy. The pair of gate layers 24A and 24B each have a belt-like shape extending in the depth direction y, as shown in FIG. 3. The gate layer 24A is located on the insulation layer 23A, as shown in FIG. 3, FIG. 9, and FIG. 10. The gate layer 24A is electrically connected to the second electrode 112 (gate electrode) of each semiconductor element 10A, via a wire 6 (gate wire 61 to be subsequently described). The gate layer 24B is located on the insulation layer 23B, as shown in FIG. 3, FIG. 9, and FIG. 10, gate layer 24B is electrically connected to the second electrode 112 (gate electrode) of each semiconductor element 10B, via a wire 6 (gate wire 61 to be subsequently described).

The pair of detection layers 25A and 25B, which are electrically insulative, are formed of copper, or a copper-based alloy. The pair of detection layers 25A and 25B each have a belt-like shape extending in the depth direction y, as shown in FIG. 3. The detection layer 25A is located on the insulation layer 23A together with the gate layer 24A, as shown in FIG. 3, FIG. 9, and FIG. 10. The detection layer 25A is located adjacent to the gate layer 24A with a spacing therefrom, on the insulation layer 23A in a plan view. In this embodiment, the detection layer 25A is located closer to the plurality of semiconductor elements 10A in the width direction x, than the gate layer 24A is. In other words, the detection layer 25A is located on the x1-side in the width direction, with respect to the gate layer 24A. Here, the gate layer 24A and the detection layer 25A may be located the other way around, in the width direction x. The detection layer 25A is electrically connected to the second electrode 111 (source electrode) of each semiconductor element 10A, via a wire 6 (detection wire 62 to be subsequently described). The detection layer 25B is located on the insulation layer 23B together with the gate layer 24B, as shown in FIG. 3, FIG. 9, and FIG. 10. The detection layer 25B is located adjacent to the gate layer 24B with a spacing therefrom, on the insulation layer 23B in a plan view. In this embodiment, the detection layer 25B is located closer to the plurality of semiconductor elements 10B in the width direction x, than the gate layer 24B is. In other words, the detection layer 25B is located on the x2-side in the width direction, with respect to the gate layer 24B. Here, the gate layer 24B and the detection layer 25B may be located the other way around, in the width direction x. The detection layer 25B is electrically connected to the second electrode 111 (source electrode) of each semiconductor element 10B, via a wire 6 (detection wire 62 to be subsequently described).

The plurality of conductive bonding layers 3 are each formed of a metal that has undergone a sintering process. In this embodiment, the conductive bonding layers 3 are each formed of sintered silver. However, other sintered metal, such as sintered copper, may be employed. The conductive bonding layers 3 have a porous structure with a multitude of minute pores and, in this embodiment, the minute pores are void. However, the minute pores may be loaded with, for example, an epoxy resin. In other words, the conductive bonding layers 3 may each be formed of a sintered metal containing an epoxy resin. Here, an excessive epoxy resin content leads to lowered conductivity of the conductive bonding layer 3, and therefore it is preferable to determine the epoxy resin content taking the current volume in the semiconductor device A1 into account. The conductive bonding layer 3 may be formed by subjecting a sinterable metal material to the sintering process. In this embodiment, the conductive bonding layers 3 each include a filet, for example as shown in FIG. 11. However, it is not mandatory that the conductive bonding layers 3 include the filet.

In this embodiment, the plurality of conductive bonding layers 3 include a plurality of element bonding layers 31A and 31B, a plurality of lead bonding layers 32, and a plurality of block bonding layers 33.

The plurality of element bonding layers 31A each serve to bond the semiconductor elements 10A to the conductive substrate 22A. The element bonding layers 31A are each interposed between the element reverse face 102 of the corresponding semiconductor element 10A and the conductive substrate 22A, thereby electrically connecting the reverse face electrode 12 of the semiconductor element 10A and the conductive substrate 22A. The element bonding layers 31A each have a thickness of approximately 20 to 80 μm. The thickness corresponds to the size in the thickness direction z, of the portion interposed between the semiconductor element 10A and the conductive substrate 22A. However, the thickness of the element bonding layers 31A is not limited to the above. Each of the element bonding layers 31A overlaps, in its entirety, with the conductive substrate 22B, as viewed in the width direction x.

The plurality of element bonding layers 31B each serve to bond the semiconductor elements 10B to the conductive substrate 22B. The element bonding layers 31B are each interposed between the element reverse face 102 of the corresponding semiconductor element 10B and the conductive substrate 22B, thereby electrically connecting the reverse face electrode 12 of the semiconductor element 10B and the conductive substrate 22B. The element bonding layers 31B each have a thickness of approximately 20 to 80 μm, like the element bonding layers 31A. The thickness corresponds to the size in the thickness direction z, of the portion interposed between the semiconductor element 10B and the conductive substrate 22B. However, the thickness of the element bonding layers 31B is not limited to the above.

The plurality of lead bonding layers 32 each serve to bond a part of the lead member 51 to the corresponding semiconductor element 10A. More specifically, the lead bonding layers 32 are each interposed between the element obverse face 101 of the semiconductor element 10A and a part of the lead member 51 (first bonding portion 511 to be subsequently described), thereby electrically connecting the obverse face electrode 11 (first electrode 111) of the semiconductor element 10A and the lead member 51. The lead bonding layers 32 each have a thickness of approximately 20 to 80 µm. The thickness corresponds to the size in the thickness direction z, of the portion interposed between the semiconductor element 10A and the lead member 51. However, the thickness of the lead bonding layer 32 is not limited to the above. The lead bonding layers 32 each overlap with the conductive substrate 22B, except for the filet, as viewed in the width direction x. In this embodiment, the lead bonding layer 32 corresponds to the "conductive bonding layer" in the present disclosure.

The plurality of block bonding layers 33 each serve to bond one of the plurality of block electrodes 48 to the corresponding semiconductor element 10B. More specifically, the block bonding layers 33 are each interposed between the element obverse face 101 of the semiconductor element 10B and the face of the block bonding layer 33 facing to the z2-side in the thickness direction, thereby electrically connecting the obverse face electrode 11 (first electrode 111) of the semiconductor element 10B and the block electrode 48. The block bonding layers 33 each have a thickness of approximately 20 to 80 µm. The thickness corresponds to the size in the thickness direction z, of the portion interposed between the semiconductor element 10B and the block electrode 48. However, the thickness of the block bonding layer 33 is not limited to the above.

The two input terminals 41 and 42 are each formed of a metal plate. The metal plate is constituted of copper, or a copper-based alloy. In this embodiment, the two input terminals 41 and 42 both have a size of approximately 0.8 mm in the thickness direction z, without limitation thereto. The two input terminals 41 and 42 are both located in a region of the semiconductor device A1 on the x2-side in the width direction, as shown in FIG. 3, FIG. 9, and FIG. 10. For example, a source voltage is applied between the two input terminals 41 and 42. To the input terminals 41 and 42, the source voltage may be directly applied from a non-illustrated power source, or via a non-illustrated busbar, connected to the input terminals 41 and 42 from the respective sides. Alternatively, a snubber circuit may be connected in parallel. The input terminal 41 is the positive electrode (P-terminal), and the input terminal 42 is the negative electrode (N-terminal). The input terminal 42 is spaced from both of the input terminal 41 and the conductive substrate 22A, in the thickness direction z.

The input terminal 41 includes, as shown in FIG. 3 and FIG. 9, a pad portion 411 and a terminal portion 412.

The pad portion 411 corresponds to the portion of the input terminal 41 covered with the sealing resin 7. An end portion of the pad portion 411 on the x1-side in the width direction is formed in a combtooth shape, and includes a plurality of combtooth portions 411a. Here, the pad portion 411 may be formed in a rectangular shape in a plan view, without the plurality of combtooth portions 411a. The plurality of combtooth portions 411a are each conductively bonded to the obverse face 221A of the conductive substrate 22A. In this embodiment, the combtooth portions 411a of the pad portion 411 are each joined to the conductive substrate 22A, by welding with a laser beam (hereinafter, "laser welding"). In this embodiment, the type of the laser beam is not specifically limited but, for example, green YAG laser may be employed. The combtooth portions 411a and the conductive substrate 22A may be joined, without limitation to the laser welding, by ultrasonic welding, or with a conductive bonding material. In the case of the laser welding, a welding mark M41 is formed as shown in FIG. 3 and FIG. 9.

The terminal portion 412 corresponds to the portion of the input terminal 41 exposed from the sealing resin 7. The terminal portion 412 extends, in a plan view, from the sealing resin 7 toward the x2-side in the width direction, as shown in FIG. 3, FIG. 5, FIG. 6, FIG. 8, and FIG. 9.

The input terminal 42 includes, as shown in FIG. 3 and FIG. 9, a pad portion 421 and a terminal portion 422.

The pad portion 421 corresponds to the portion of the input terminal 42 covered with the sealing resin 7. The pad portion 421 includes a connecting portion 421a and a plurality of protruding portions 421b. The connecting portion 421a has a belt-like shape extending in the depth direction y. The connecting portion 421a is connected to the terminal portion 422. The plurality of protruding portions 421b each have a belt-like shape extending from the connecting portion 421a toward the x1-side in the width direction. In this embodiment, the protruding portions 421b each extend from the connecting portion 421a as far as a position overlapping with the semiconductor element 10B, in a plan view. The plurality of protruding portions 421b are aligned in the depth direction y with a spacing from each other, in a plan view. The protruding portions 421b each have the distal portion overlapping with the corresponding block electrode 48, in a plan view. The distal portion is joined to the block electrode 48, by laser welding. In this embodiment, the distal portion refers to the portion of the protruding portion 421b on the opposite side of the connecting portion 421a in the width direction x, and the edge portion on the x1-side in the width direction. Here, the protruding portions 421b and the respective block electrodes 48 may be joined, without limitation to the laser welding, by ultrasonic welding, or with a conductive bonding material. In the case of the laser welding, a welding mark M42 is formed as shown in FIG. 3, FIG. 4, and FIG. 9.

The terminal portion 422 corresponds to the portion of the input terminal 42 exposed from the sealing resin 7. The terminal portion 422 extends, in a plan view, from the sealing resin 7 toward the x2-side in the width direction, as shown in FIG. 3, FIG. 5, FIG. 8, and FIG. 9. The terminal portion 422 has a rectangular shape in a plan view. The terminal portion 422 overlaps with the terminal portion 412 of the input terminal 41 in a plan view, as shown in FIG. 3, FIG. 8, and FIG. 9. The terminal portion 422 is spaced from the terminal portion 412 to the z2-side in the thickness direction. In this embodiment, the terminal portion 422 has the same shape as that of the terminal portion 412.

The output terminal 43 is formed of a metal plate. The metal plate is, for example, constituted of copper, or a copper-based alloy. The output terminal 43 is located in a region of the semiconductor device A1 on the x1-side in the width direction, as shown in FIG. 3 and FIG. 9. AC power (voltage) converted by the plurality of semiconductor elements 10 is outputted from the output terminal 43.

The output terminal 43 includes, as shown in FIG. 3 and FIG. 9, a pad portion 431 and a terminal portion 432.

The pad portion 431 corresponds to the portion of the output terminal 43 covered with the sealing resin 7. An end portion of the pad portion 431 on the x2-side in the width direction is formed in a combtooth shape, and includes a plurality of combtooth portions 431a. Here, the pad portion 431 may be formed in a rectangular shape in a plan view, without the plurality of combtooth portions 431a. The plurality of combtooth portions 431a are each conductively bonded to the obverse face 221B of the conductive substrate 22B. In this embodiment, the combtooth portions 431a of the pad portion 431 are each joined to the conductive substrate 22B, by laser welding. The combtooth portions 431a and the conductive substrate 22B may be joined, without limitation to the laser welding, by ultrasonic welding, or with a conductive bonding material. In the case of the laser welding, a welding mark M43 is formed as shown in FIG. 3 and FIG. 9.

The terminal portion 432 corresponds to the portion of the output terminal 43 exposed from the sealing resin 7. The terminal portion 432 extends from the sealing resin 7 toward the x1-side in the width direction, as shown in FIG. 3, FIG. 5, FIG. 6, FIG. 7, and FIG. 9.

The pair of gate terminals 44A and 44B are located adjacent to the conductive substrates 22A and 22B, respectively, in the depth direction y, as shown in FIG. 1 to FIG. 6. A gate voltage for driving the plurality of semiconductor elements 10A is applied to the gate terminal 44A. A gate voltage for driving the plurality of semiconductor elements 10B is applied to the gate terminal 44B.

The pair of gate terminals 44A and 44B both include a pad portion 441 and a terminal portion 442, as shown in FIG. 3 and FIG. 4. In each of the gate terminals 44A and 44B, the pad portion 441 is covered with the sealing resin 7. Therefore, the gate terminals 44A and 44B are each supported by the sealing resin 7. The surface of the pad portion 441 may be, for example, plated with silver. The terminal portion 442 is connected to the pad portion 441, and exposed from the sealing resin 7. The terminal portion 442 has an L-shape, as viewed in the width direction x.

The pair of detection terminals 45A and 45B are located adjacent to the pair of gate terminals 44A and 44B, respectively, in the width direction x, as shown in FIG. 1 to FIG. 6. From the detection terminal 45A, a voltage (corresponding to source current) applied to the respective obverse face electrodes 11 (first electrode 111) of the plurality of semiconductor elements 10A is detected. From the detection terminal 45B, a voltage (corresponding to source current) applied to the respective obverse face electrodes 11 (first electrode 111) of the plurality of semiconductor elements 10B is detected.

The pair of detection terminals 45A and 45B both include a pad portion 451 and a terminal portion 452, as shown in FIG. 3 and FIG. 4. In each of the detection terminals 45A and 45B, the pad portion 451 is covered with the sealing resin 7. Therefore, the detection terminals 45A and 45B are each supported by the sealing resin 7. The surface of the pad portion 451 may be, for example, plated with silver. The terminal portion 452 is connected to the pad portion 451, and exposed from the sealing resin 7. The terminal portion 452 has an L-shape, as viewed in the width direction x.

The plurality of dummy terminals 46 are located on the opposite side of the pair of detection terminals 45A and 45B with respect to the pair of gate terminals 44A and 44B, respectively, in the width direction x, as shown in FIG. 1 to FIG. 6. In this embodiment, six dummy terminals 46 are provided. Three of those dummy terminals 46 are located on one side (x2-side) in the width direction. The remaining three dummy terminals 46 are located on the other side (x1-side) in the width direction. The configuration of the plurality of dummy terminals 46 is not limited to the above. Further, the plurality of dummy terminals 46 may be omitted.

The plurality of dummy terminals 46 each include a pad portion 461 and a terminal portion 462, as shown in FIG. 3 and FIG. 4. In each of the dummy terminals 46, the pad portion 461 is covered with the sealing resin 7. Therefore, the dummy terminals 46 are each supported by the sealing resin 7. The surface of the pad portion 461 may be, for example, plated with silver. The terminal portion 462 is connected to the pad portion 461, and exposed from the sealing resin 7. The terminal portion 462 has an L-shape, as viewed in the width direction x. The shape of the terminal portion 462 is the same as that of the terminal portion 442 of the pair of gate terminals 44A and 44B, and that of the terminal portion 452 of the pair of detection terminals 45A and 45B.

The pair of side terminals 47A and 47B are located, in a plan view, at the end portion of the sealing resin 7 on the y1-side in the depth direction, and overlap with the respective edges of the sealing resin 7 in the width direction x, as shown in FIG. 3. The side terminal 47A is bonded to the conductive substrate 22A, and covered with the sealing resin 7, except for the end face facing to the x2-side in the width direction. The side terminal 47B is bonded to the conductive substrate 22B, and covered with the sealing resin 7, except for the end face facing to the x1-side in the width direction. In this embodiment, the side terminals 47A and 47B overlap in their entirety with the sealing resin 7, in a plan view. The side terminals 47A and 47B are respectively joined to the conductive substrates 22A and 22B, by laser welding. Here, the side terminal 47A and the conductive substrate 22A, and also the side terminal 47B and the conductive substrate 22B, may be joined, without limitation to the laser welding, by ultrasonic welding, or with a conductive bonding material. In the case of the laser welding, a welding mark M47 is formed as shown in FIG. 3 and FIG. 10. The side terminals 47A and 47B each include a portion that is bent in a plan view, and another portion that is bent in the thickness direction z. The configuration of the side terminals 47A and 47B is not limited to the above. For example, the side terminals 47A and 47B may further extend so as to protrude from the sealing resin 7, in a plan view. Further, the semiconductor device A1 may be without the side terminals 47A and 47B.

The pair of gate terminals 44A and 44B, the pair of detection terminals 45A and 45B, and the plurality of dummy terminals 46 are aligned along the width direction x in a plan view, as shown in FIG. 1 to FIG. 6. In the semiconductor device A1, the pair of gate terminals 44A and 44B, the pair of detection terminals 45A and 45B, the plurality of dummy terminals 46, and the pair of side terminals 47A and 47B are formed from the same lead frame.

The plurality of block electrodes 48 are each interposed between a part of the input terminal 42 and the element obverse face 101 of the corresponding semiconductor element 10B, as shown in FIG. 3 and FIG. 9, thereby electrically connecting the input terminal 42 and the obverse face electrode 11 (first electrode 111) of the semiconductor element 10B. Accordingly, the input terminal 42 is electrically connected to the first electrode 111 of the respective first electrodes 111 of the semiconductor elements 10B, via the plurality of block electrodes 48. The block electrodes 48 are each bonded to the first electrode 111 of the semiconductor element 10B, via the conductive bonding layer 3 (block bonding layer 33). The block electrodes 48 are each located so as to overlap with the semiconductor element 10B, and the distal portion of the protruding portion 421b of the input terminal 42, in a plan view. The block electrodes 48 are joined to the distal portion of the respective protruding portions 421b of the input terminal 42, by laser welding. The block electrodes are electrically conductive. The material of the block electrode 48 is not specifically limited but, for example, copper (Cu), a copper-molybdenum (CuMo) composite material, a copper-inver-copper (CIC) composite material may be employed. In this embodiment, the block electrodes 48 are formed in a square column shape, having a rectangular shape in a plan view. However, the shape of the block electrode 48 may be formed in a circular column shape having a circular shape in a plan view, without limitation to the above.

The insulation plate 49, which is electrically insulative, is formed of insulation paper, for example. A part of the insulation plate 49 is plate-shaped, and interposed between the terminal portion 412 of the input terminal 41 and the terminal portion 422 of the input terminal 42, in the thickness direction z, as shown in FIG. 3, FIG. 5, FIG. 8, FIG. 9, and FIG. 10. In a plan view, the input terminal 41 overlaps in its entirety with the insulation plate 49. In addition, in the input terminal 42, a part of the pad portion 421 and the entirety of the terminal portion 422 overlap with the insulation plate 49, in a plan view. The insulation plate 49 serves to insulate between the two input terminals 41 and 42. A part of the insulation plate 49 (portion on the x1-side in the width direction) is covered with the sealing resin 7.

The insulation plate 49 includes, as shown in FIG. 3 and FIG. 9, an intermediate portion 491 and a protruding portion 492. The intermediate portion 491 is interposed between the terminal portion 412 of the input terminal 41 and the terminal portion 422 of the input terminal 42, in the thickness direction z. The entirety of the intermediate portion 491 is interposed between the terminal portion 412 and the terminal portion 422. The protruding portion 492 further extends from the intermediate portion 491 toward the x2-side in the width direction, with respect to the terminal portion 412 and the terminal portion 422.

The plurality of lead members 51 serve to connect the semiconductor elements 10A and the conductive substrate 22B. The lead members 51 are, for example, each formed of copper. The lead members 51 may be formed of a clad material such as CIC. As shown in FIG. 3, and FIG. 4, the lead members 51 each have a rectangular shape extending in the width direction x, in a plan view. The lead members 51 are flat plate-shaped connecting members. In this embodiment, the lead members 51 each have a size in the thickness direction z (i.e., thickness) of approximately 160 to 250 μm. However, the thickness of the lead members 51 is not limited to the above. The lead members 51 are located on the z2-side in the thickness direction, with respect to the obverse face 221B of the conductive substrate 22B. The lead members 51 each correspond to the "connecting member" in the present disclosure.

The lead members 51 each include a first bonding portion 511, a second bonding portion 512, and a communicating portion 513.

The first bonding portion 511 is bonded to the obverse face electrode 11 (first electrode 111) of the semiconductor element 10A, via the conductive bonding layer 3 (lead bonding layer 32). In a plan view, the first bonding portion 511 overlaps with the first electrode 111 of the semiconductor element 10A, the lead bonding layer 32, and the semiconductor element 10A.

The second bonding portion 512 is bonded to the conductive substrate 22B by laser welding, as shown in FIG. 3, FIG. 10, and FIG. 11. The second bonding portion 512 includes a welding mark M51 formed because of the laser welding.

The communicating portion 513 is connected to the first bonding portion 511 and the second bonding portion 512. The communicating portion 513 overlaps with both of the first bonding portion 511 and the second bonding portion 512, as viewed in the width direction x.

The lead members 51 each include a lead obverse face 51a. The lead obverse face 51a faces to the z2-side in the thickness direction. In this embodiment, the lead obverse face 51a is generally flat. The lead obverse face 51a includes the respective faces of the first bonding portion 511, the second bonding portion 512, and the communicating portion 513, facing to the z2-side in the thickness direction.

Each of the plurality of wires 6 is what is known as a bonding wire. The wires 6, which are electrically conductive, are formed of, for example, one of aluminum, gold, and copper. In this embodiment, the plurality of wires 6 include a plurality of gate wires 61, a plurality of detection wires 62, a pair of first connection wires 63, and a pair of second connection wires 64, as shown in FIG. 3 and FIG. 4.

The plurality of gate wires 61 each have one end bonded to the second electrode 112 (gate electrode) of the semiconductor element 10, and the other end bonded to one of the pair of gate layers 24A and 24B, as shown in FIG. 3 and FIG. 4. The plurality of gate wires 61 include the one electrically connecting the second electrode 112 of the semiconductor element 10A and the gate layer 24A, and the one electrically connecting the second electrode 112 of the semiconductor element 10B and the gate layer 24B.

The plurality of detection wires 62 each have one end bonded to the first electrode 111 (source electrode) of the semiconductor element 10, and the other end bonded to one of the pair of detection layers 25A and 25B, as shown in FIG. 3 and FIG. 4. The plurality of detection wires 62 include the one electrically connecting the first electrode 111 of the semiconductor element 10A and the detection layer 25A, and the one electrically connecting the first electrode 111 of the semiconductor element 10B and the detection layer 25B.

Of the pair of first connection wires 63, as shown in FIG. 3 and FIG. 4, one connects the gate layer 24A and the gate terminal 44A, and the other connects the gate layer 24B and the gate terminal 44B. The one of the first connection wires 63 has one end bonded to the gate layer 24A, and the other end bonded to the pad portion 441 of the gate terminal 44A, thus electrically connecting therebetween. The other of the first connection wires 63 has one end bonded to the gate layer 24B and the other end bonded to the pad portion 441 of the gate terminal 44B, thus electrically connecting therebetween.

Of the pair of second connection wires 64, as shown in FIG. 3 and FIG. 4, one connects the detection layer 25A and the detection terminal 45A, and the other connects the detection layer 25B and the detection terminal 45B. The one of the second connection wires 64 has one end bonded to the detection layer 25A, and the other end bonded to the pad portion 451 of the detection terminal 45A, thus electrically connecting therebetween. The other of the second connection wires 64 has one end bonded to the detection layer 25B and the other end bonded to the pad portion 451 of the detection terminal 45B, thus electrically connecting therebetween.

The sealing resin 7 covers, as shown in FIG. 1 to FIG. 3, and FIG. 5 to FIG. 10, the plurality of semiconductor elements 10, a part of the support substrate 20, the plurality of conductive bonding layers 3, a part of each of the terminals 40, the plurality of lead members 51, and the plurality of wires 6. The sealing resin 7 is, for example, formed of an epoxy resin. The sealing resin 7 includes a resin obverse face 71, a resin reverse face 72, and a plurality of resin side faces 731 to 734, as shown in FIG. 1 to FIG. 3, and FIG. 5 to FIG. 10.

The resin obverse face 71 and the resin reverse face 72 are spaced from each other and oriented in opposite directions, in the thickness direction z, as shown in FIG. 5, and FIG. 7 to FIG. 10. The resin obverse face 71 faces to the z2-side in the thickness direction, and the resin reverse face 72 faces to the z1-side in the thickness direction. The resin reverse face 72 is, as shown in FIG. 6, formed in a frame shape surrounding the reverse face 212 of the insulation substrate 21, in a plan view. The reverse face 212 of the insulation substrate 21 is exposed from the resin reverse face 72. The plurality of resin side faces 731 to 734 are each connected to both of the resin obverse face 71 and the resin reverse face 72, and interposed therebetween in the thickness direction z. In this embodiment, the resin side faces 731 and 732 are spaced from each other and oriented in opposite directions, in the width direction x. The resin side face 731 faces to the x2-side in the width direction, and the resin side face 732 faces to the x1-side in the width direction. The resin side faces 733 and 734 are spaced from each other and oriented in opposite directions, in the depth direction y. The resin side face 733 faces to the y2-side in the depth direction, and the resin side face 734 faces to the y1-side in the depth direction.

In this embodiment, the sealing resin 7 includes a plurality of recesses 75, each recessed from the resin reverse face 72 in the thickness direction z, as shown in FIG. 5, FIG. 6, FIG. 9, and FIG. 10. Here, the sealing resin 7 may be without these recesses 75. The plurality of recesses 75 each extend in the depth direction y, all the way from the edge of the resin reverse face 72 on the y1-side in the depth direction, to the edge on the y2-side in the depth direction, in a plan view. In this embodiment, three recesses 75 are formed on the respective sides of the reverse face 212 of the insulation substrate 21 in the width direction x, in a plan view.

A manufacturing method of the semiconductor device A1 according to the first embodiment will be described below.

First, the support substrate 20 is prepared. In the process of preparing the support substrate 20 (support substrate preparation process), the insulation substrate 21 having the obverse face 211, the conductive substrate 22A having the obverse face 221A, and the conductive substrate 22B having the obverse face 221B are prepared. The conductive substrate 22A and the conductive substrate 22B are metal plates each having a rectangular shape in a plan view. The conductive substrates 22A and 22B are different in size in the thickness direction z, the conductive substrate 22B being larger. The difference in size in the thickness direction z is approximately 100 to 500 μm. Then the conductive substrate 22A is bonded with the bonding material 220A, and the conductive substrate 22B with the bonding material 220B, to the obverse face 211 of the insulation substrate 21. At this point, the conductive substrates 22A and 22B are located with a spacing from each other, with the respective obverse faces 221A and 221B facing in the same direction as the obverse face 211 of the insulation substrate 21. The conductive substrates 22A and 22B are both located on the obverse face 211 of the insulation substrate 21. Therefore, a level difference is created between the obverse face 221A of the conductive substrate 22A and the obverse face 221B of the conductive substrate 22B, owing to the difference in size in the thickness direction z. The distance between the obverse face 211A and the obverse face 211B in the thickness direction z is approximately 100 to 500 μm, which is the same as the difference in size between the conductive substrate 22A and the conductive substrate 22B in the thickness direction z. Then the pair of insulation layers 23A and 23B, the pair of gate layers 24A and 24B, and the pair of detection layers 25A, 25B are bonded onto the conductive substrates 22A and 22B. Here, the insulation layer 23A, the gate layer 24A, and the detection layer 25A may be bonded to the conductive substrate 22A, before the conductive substrate 22A is bonded to the insulation substrate 21. Likewise, the insulation layer 23B, the gate layer 24B, and the detection layer 25B may be bonded to the conductive substrate 22B, before the conductive substrate 22B is bonded to the insulation substrate 21.

Then the plurality of sinterable metal materials 301A are formed. The sinterable metal material 301A serves as the prime material of the element bonding layer 31A. In this embodiment, paste-type sinterable silver is employed as the sinterable metal material 301A. The paste-type sinterable silver is obtained by mixing micro-sized or nano-sized silver particles in a solvent. In this embodiment, the solvent for the sinterable silver is free from, or substantially free from epoxy resin. In the process of forming the sinterable metal materials 301A (first sinterable metal material forming process), the sinterable metal materials 301A are applied to the conductive substrate 22A, for example by screen printing with a mask. However, the forming method of the plurality of sinterable metal materials 301A is not limited to the screen printing. For example, a dispenser may be employed, to apply the sinterable metal material 301A. The thickness of the sinterable metal material 301A applied as above is approximately 50 to 300 μm.

The plurality of sinterable metal materials 301A are then dried. In this drying process (first drying process), the sinterable metal materials 301A are heated at a temperature of approximately 140° C., for approximately 20 minutes. Here, the heating condition is not limited to the above. Through this process, the solvent of the sinterable metal material 301A is vaporized.

Then the semiconductor element 10A is mounted on each of the plurality of sinterable metal materials 301A. In the process of mounting the semiconductor element 10A (first mounting process), the semiconductor element 10A is mounted on the conductive substrate 22A, with the element reverse face 102 of the semiconductor element 10A opposed to the conductive substrate 22A.

Then the sinterable metal material 302 is formed on each of the plurality of semiconductor elements 10A. The sinterable metal material 302 serves as the prime material of the lead bonding layer 32. In this embodiment, preformed sinterable silver is employed as the sinterable metal material 302. The preformed sinterable silver can be obtained, for example, by drying the paste-type sinterable silver and forming into a predetermined shape. The preformed sinterable silver may be again dried, after being formed into the predetermined shape. In the process of forming the sinterable metal material 302 (second sinterable metal material forming process), each of the plurality of sinterable metal materials 302 is mounted on one of the plurality of semiconductor elements 10A. The thickness of the sinterable metal material 302 mounted as above is approximately 20 to 140 μm.

The semiconductor elements 10A and the conductive substrate 22B are then connected, with the plurality of lead members 51. In the process of connecting the lead members 51 (lead connecting process), the lead members 51 are each placed such that one end portion on the x2-side in the width direction overlaps with the sinterable metal material 302, and the other end portion on the x1-side in the width direction overlaps with the conductive substrate 22B, in a plan view. At this point, the lead members 51 are each placed generally parallel to a plane orthogonal to the thickness direction z (x-y plane).

Figure 13:
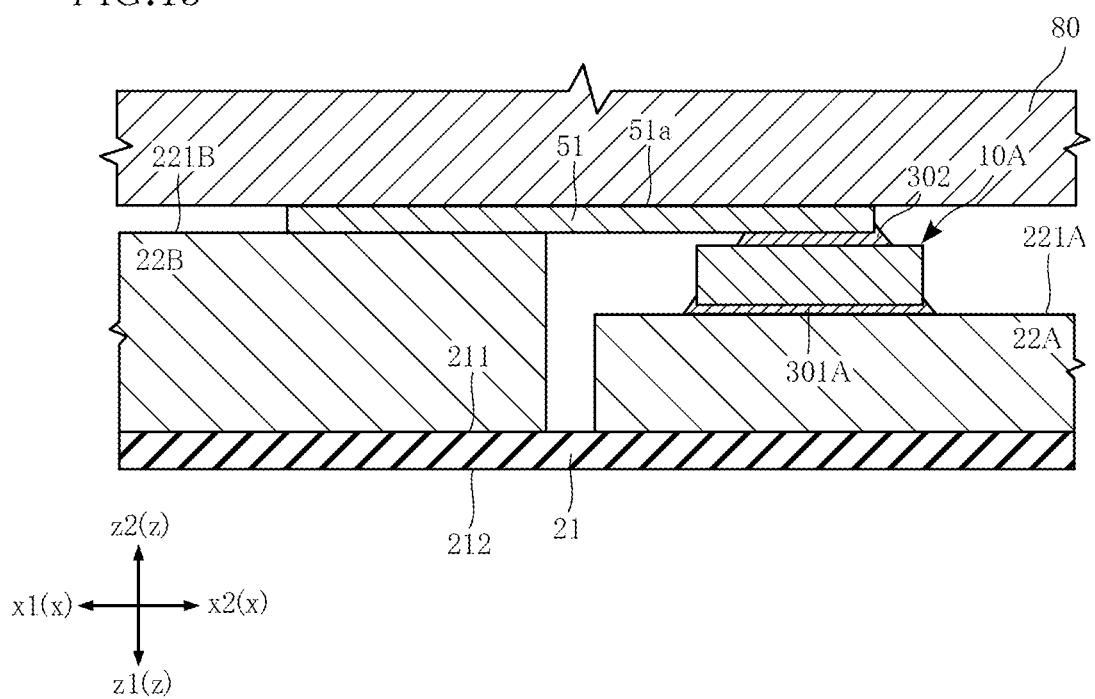
FIG. 13 is a cross-sectional view for explaining the first press-heating process, in the manufacturing method of the semiconductor device according to the first embodiment.

Then pressure-heating is performed, to turn the sinterable metal materials 301A and 302 to sintered metals. In this pressure-heating process (first pressure-heating process), a pressurizing member 80 is employed to press the lead members 51 from the side of the lead obverse face 51a, as shown in FIG. 13, to apply pressure to the plurality of sinterable metal materials 301A and 302. A buffer, for example made of carbon or Teflon (registered trademark), may be attached to the pressing surface of the pressurizing member 80. In this process, since the lead members 51 are placed generally parallel to the x-y plane, the pressurizing member 80 contacts the lead obverse face 51a of each lead member 51, with a uniform pressure. Then the sinterable metal materials 301A and 302, pressed via the lead member 51, are heated at a temperature of approximately 250° C., for approximately 90 seconds. Here, the heating condition is not limited to the above. As result, the silver particles are bonded together in each of the plurality of sinterable metal materials 301A and 302, thus turning into the sintered metals. Through the first pressure-heating process, the sinterable metal material 301A is formed into the element bonding layer 31A of the conductive bonding layer 3, and the sinterable metal material 302 is formed into the lead bonding layer 32 of the conductive bonding layer 3. In addition, the filet is formed on each of the element bonding layers 31A and the lead bonding layers 32. Here, the sintering process according to the present disclosure refers to the drying process and the pressure-heating process, in the case of forming the sintered metal from the paste-type sinterable metal material, and to the pressure-heating process, in the case of forming the sintered metal from the preformed sinterable metal material.

Then the other end portion of each of the lead members 51 on the x1-side in the width direction is bonded to the conductive substrate 22B. In the process of bonding the lead member 51 (lead bonding process), the laser welding is employed. The type of the laser beam used in the laser welding is not specifically limited but, for example, green YAG laser may be employed. As a result, the welding mark M51 is formed, and the lead members 51 are conductively bonded to the conductive substrate 22B.

Then the plurality of sinterable metal materials 301B are formed. The sinterable metal material 301B serves as the prime material of the element bonding layer 31B. In this embodiment, the paste-type sinterable silver is employed as the sinterable metal material 301B, like the case of the sinterable metal material 301A. In the process of forming the sinterable metal material 301B (third sinterable metal material forming process), the sinterable metal materials 301B are applied to the conductive substrate 22B, for example by screen printing with a mask, as in the first sinterable metal material forming process. However, the forming method of the plurality of sinterable metal materials 301B is not limited to the screen printing. For example, a dispenser may be employed, to apply the sinterable metal material 301B. The thickness of the sinterable metal material 301B applied as above is approximately 50 to 100 μm.

The plurality of sinterable metal materials 301B are then dried. In the drying process (second drying process), the sinterable metal materials 301B are heated at a temperature of approximately 140° C., for approximately 20 minutes. Here, the heating condition is not limited to the above. Through this process, the solvent of the sinterable metal material 301B is vaporized.

Then the semiconductor element 10B is mounted on each of the plurality of sinterable metal materials 301B. In the process of mounting the semiconductor element 10B (second mounting process), the semiconductor element 10B is mounted on the conductive substrate 22B, with the element reverse face 102 of the semiconductor element 10B opposed to the conductive substrate 22B.

Figure 14:
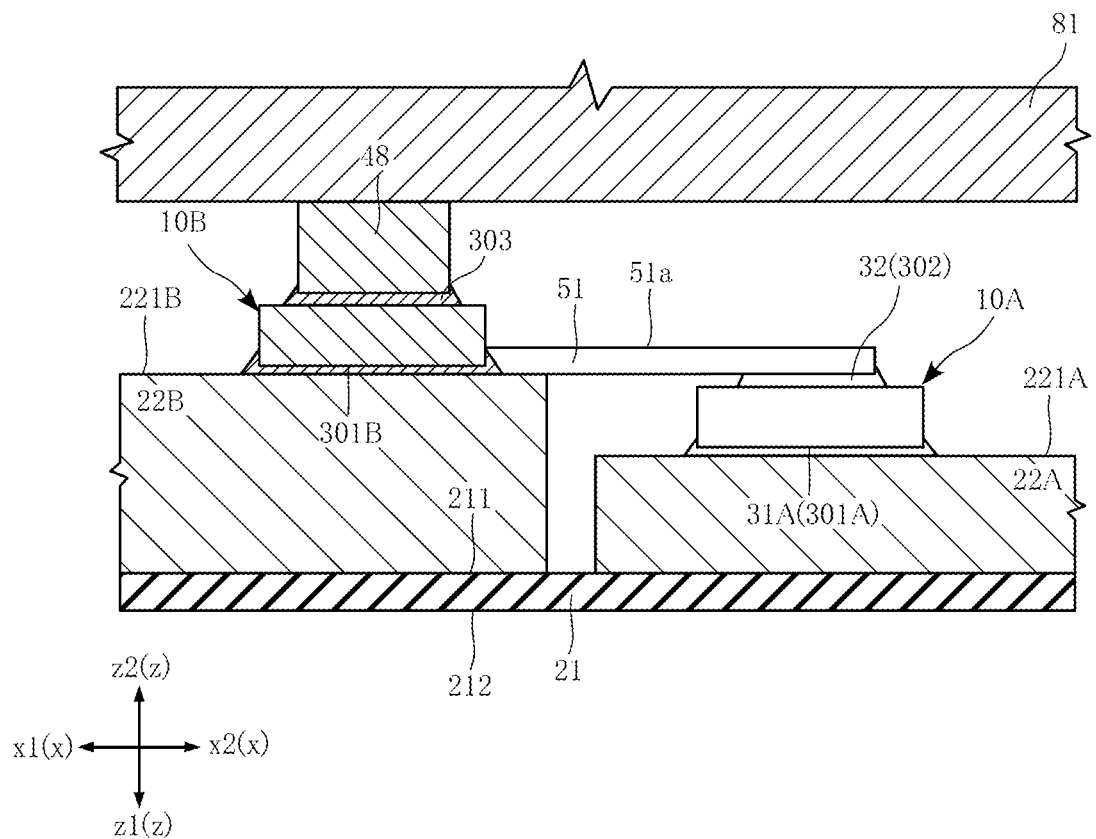
FIG. 14 is a cross-sectional view for explaining a second press-heating process, in the manufacturing method of the semiconductor device according to the first embodiment.

Then the sinterable metal material 303 is formed on each of the plurality of semiconductor elements 10B. The sinterable metal material 303 serves as the prime material of the block bonding layer 33. In this embodiment, the preformed sinterable silver is employed as the sinterable metal material 303, like the case of the sinterable metal material 302. In the process of forming the sinterable metal material 303 (fourth sinterable metal material forming process), each of the plurality of sinterable metal materials 303 is mounted on one of the plurality of semiconductor elements 10B, as shown in FIG. 14. Here, although the sinterable metal material 303 includes the filet in FIG. 14, the shape of the cross-section parallel to the thickness direction z, of the sinterable metal material 303 that has undergone the fourth sinterable metal material forming process, is generally rectangular. The thickness of the sinterable metal material 303 mounted as above is approximately 20 to 140 μm.

Then the block electrode 48 is mounted on each of the plurality of sinterable metal materials 303, as shown in FIG. 14. The process of mounting the block electrode 48 will be referred to as block electrode mounting process.

Then pressure-heating is performed, to turn the sinterable metal materials 301B and 303 to sintered metals. In this pressure-heating process (second pressure-heating process), a pressurizing member 81, which is different from the pressurizing member 80, is employed to press the block electrodes 48 from the upper side, as shown in FIG. 14, to apply pressure to the plurality of sinterable metal materials 301B and 303. Here, the pressurizing member 80 and the pressurizing member 81 may be the same one. Then the sinterable metal materials 301B and 303, pressed via the block electrodes 48, are heated at a temperature of approximately 250° C., for approximately 90 seconds. Here, the heating condition is not limited to the above. As result, the silver particles are bonded together in each of the plurality of sinterable metal materials 301B and 303, thus turning into the sintered metals. Through the second pressure-heating process, the sinterable metal material 301B is formed into the element bonding layer 31B of the conductive bonding layer 3, and the sinterable metal material 303 is formed into the block bonding layer 33 of the conductive bonding layer 3. In addition, the filet is formed on each of the element bonding layers 31B and the block bonding layers 33.

Then the plurality of terminals 40 are bonded. The process of bonding the terminals 40 (terminal bonding process) includes the following steps. The order of the following steps is not specifically limited. To bond the input terminal 41, the combtooth portion 411a is bonded to the obverse face 221A of the conductive substrate 22A. For this process, either the laser welding or the ultrasonic welding may be employed. To bond the output terminal 43, the combtooth portion 431a is bonded to the obverse face 221B of the conductive substrate 22B. For this process, either the laser welding or the ultrasonic welding may be employed. In the case of the input terminal 42, the input terminal 42 is bonded to the input terminal 41 and the block electrode 48, with the insulation plate 49 interposed therebetween. At this point, the distal portion of each of the protruding portions 421b of the input terminal 42 is made to contact the corresponding block electrode 48, so as to overlap therewith in a plan view. Here, a non-illustrated adhesive is used to bond the input terminal 42 to the insulation plate 49, and the laser welding is used to bond the input terminal 42 to the block electrode 48. The pair of gate terminals 44A and 44B, the pair of detection terminals 45A and 45B, the plurality of dummy terminals 46, and the pair of side terminals 47A and 47B are formed on the same lead frame, and connected to one another. Accordingly, the portions of the lead frame corresponding to the side terminals 47A and 47B are respectively bonded to the obverse face 221A of the conductive substrate 22A and the obverse face 221B of the conductive substrate 22B. For this process, either the laser welding or the ultrasonic welding may be employed.

Then the plurality of wires 6 are formed. In the process of forming the wires 6 (wire forming process), for example a known wire bonder is employed. The wire forming process includes forming the plurality of gate wires 61, each connecting the second electrode 112 of the semiconductor element 10A and the gate layer 24A, and the plurality of gate wires 61, each connecting the second electrode 112 of the semiconductor element 10B and the gate layer 24B. The wire forming process also includes forming the plurality of detection wires 62 each connecting the first electrode 111 of the semiconductor element 10A and the detection layer 25A, and the plurality of detection wires 62 each connecting the first electrode 111 of the semiconductor element 10B and the detection layer 25B. Further, the first connection wire 63 connecting the gate layer 24A and the gate terminal 44A, and the first connection wire 63 connecting the gate layer 24B and the gate terminal 44B, are formed. Still further, the second connection wire 64 connecting the detection layer 25A and the detection terminal 45A, and the second connection wire 64 connecting the detection layer 25B and the detection terminal 45B, are formed. Here, the order of forming the plurality of wires 6 is not specifically limited.

Then the sealing resin 7 is formed. For the process of forming the sealing resin 7 (resin forming process), for example a transfer molding method is employed. The sealing resin 7 is, for example, formed of an epoxy resin. In this embodiment, the sealing resin 7 is formed so as to cover the plurality of semiconductor elements 10, a part of the support substrate 20, the plurality of conductive bonding layers 3, a part of each of the plurality of terminals 40, the plurality of lead members 51, and the plurality of wires 6. From the sealing resin 7 thus formed, a part of each of the terminals 40, and a part of the support substrate 20, specifically the reverse face 212 of the insulation substrate 21, are exposed.

Thereafter, various types of post-processings are performed, if need be. The post-processings include, for example, cutting an unnecessary portion of the plurality of terminals 40 (e.g., a part of the lead frame), and bending the plurality of terminals 40. The post-processing may also include engraving or printing a letter or a mark on the sealing resin 7.

Through the foregoing process, the semiconductor device A1 shown in FIG. 1 to FIG. 11 can be obtained. The foregoing manufacturing method is merely exemplary, and the present disclosure is not limited thereto.

Hereunder, the advantages of the semiconductor device A1 according to the first embodiment, and the manufacturing method thereof, will be described.

In the semiconductor device A1, the semiconductor elements 10A mounted on the conductive substrate 22A are electrically connected to the conductive substrate 22B, via the lead members 51. The conductive substrate 22A, the semiconductor elements 10A, and the lead bonding layer 32 overlap with the conductive substrate 22B, as viewed in the width direction x. Because of such configuration, a level difference is created between the face on which the semiconductor elements 10A are mounted, and the face to which the second bonding portion 512 of the lead member is bonded. In this embodiment, the face on which the semiconductor elements 10A are mounted corresponds to the obverse face 221A of the conductive substrate 22A, and the face to which the second bonding portion 512 of the lead member 51 is bonded corresponds to the obverse face 221B of the conductive substrate 22B. Accordingly, for example, the lead members 51 can be formed in a flat plate shape without a bent portion. Such a configuration facilitates the lead obverse faces 51a of the respective lead members 51 to be uniformly pressed, in the pressure-heating process (sintering process). Therefore, the pressing force can be prevented from becoming uneven, and consequently the breakdown of the semiconductor element 10A, and the lack of strength of the conductive bonding layer 3 can be prevented. As result, degradation in reliability of the semiconductor device A1 can be prevented.

In the semiconductor device A1, the lead members 51 of a flat plate shape are employed. Such a configuration eliminates the need to bend the lead member 51, thereby minimizing the manufacturing error, with respect to the shape of the lead member 51. Therefore, the pressing force of the pressurizing member 80, applied to the lead members 51, can be prevented from becoming uneven.

In the semiconductor device A1, the plurality of semiconductor elements 10A are mounted on the conductive substrate 22A formed of a metal plate, and the plurality of semiconductor elements 10B are mounted on the conductive substrate 22B, also formed of a metal plate. Accordingly, the conductive substrates 22A and 22B each serve as a heat dissipation plate for releasing the heat generated when power is supplied to the semiconductor elements 10A and 10B. Thus, the heat dissipation performance of the semiconductor device A1 can be improved, and malfunction arising from heat can be prevented.

In the semiconductor device A1, the lead members 51 are bonded to the conductive substrate 22B by laser welding, in the lead bonding process. Accordingly, the second bonding portions 512 of the respective lead members 51 are bonded by laser welding. In the case of the laser welding, the heat is only locally generated, and kept from spreading widely. In the existing semiconductor device (Patent Document 1), the both end portions of the beam lead are bonded with a sintered bonding material. In the sintering process to form the sintered bonding material, the sintered bonding materials on the respective end portions of the beam lead are cured at the same time, while the temperature falls after the heating, and the substrate may be warped owing to the stress applied during the curing process. In this embodiment, in contrast, one end portion of the lead member 51 is bonded by laser welding. Accordingly, since the amount of heat produced by laser welding is low as mentioned above, the stress that may warp the substrate (support substrate 20) is limited. Consequently, the semiconductor device A1 is capable of suppressing the support substrate 20 from being warped.

To manufacture the semiconductor device A1, the sinterable metal materials 301A formed under the semiconductor elements 10A, and the sinterable metal materials 302 formed on the semiconductor elements 10A are subjected to the pressure-heating, at the same time. In other words, the element bonding layer 31A and the lead bonding layer 32 are sintered at the same time, in the first pressure-heating process. Accordingly, the element bonding layer 31A and the lead bonding layer 32 can be obtained from the sinterable metal materials 301A and 302, through a single session of the pressure-heating process, and therefore the productivity of the semiconductor device A1 can be improved.

In the semiconductor device A1, the block electrode 48 is bonded to the element obverse face 101 of each of the semiconductor elements 10B, and a part of the input terminal 42 (distal portion of the protruding portion 421b) is bonded to the block electrode 48. Such a configuration allows the lead member 51 and the protruding portion 421b of the input terminal 42 to be apart from each other in the thickness direction z, thereby preventing an accidental short-circuit.

To manufacture the semiconductor device A1, the sinterable metal materials 301B formed under the semiconductor elements 10B, and the sinterable metal materials 303 formed on the semiconductor elements 10B are subjected to the pressure-heating, at the same time. In other words, the element bonding layer 31B and the block bonding layer 33 are sintered at the same time, in the second pressure-heating process. Accordingly, the element bonding layer 31B and the block bonding layer 33 can be obtained from the sinterable metal materials 301B and 303, through a single session of the pressure-heating process, and therefore the productivity of the semiconductor device A1 can be improved.

In the semiconductor device A1, the element bonding layers 31A and 31B are formed from the sinterable metal materials 301A and 301B, respectively, which are made of paste-type sinterable silver. The paste-type sinterable silver is less expensive than the preformed sinterable silver. Therefore, the manufacturing cost of the semiconductor device A1 can be reduced. In this embodiment, however, the element bonding layers 31A and 31B may be formed from the preformed sinterable silver. In other words, the preformed sinterable silver may be employed as the sinterable metal materials 301A and 301B. In this case, although the manufacturing cost of the semiconductor device A1 is increased, the drying process can be skipped. Therefore, the productivity can be improved.

Figure 15:
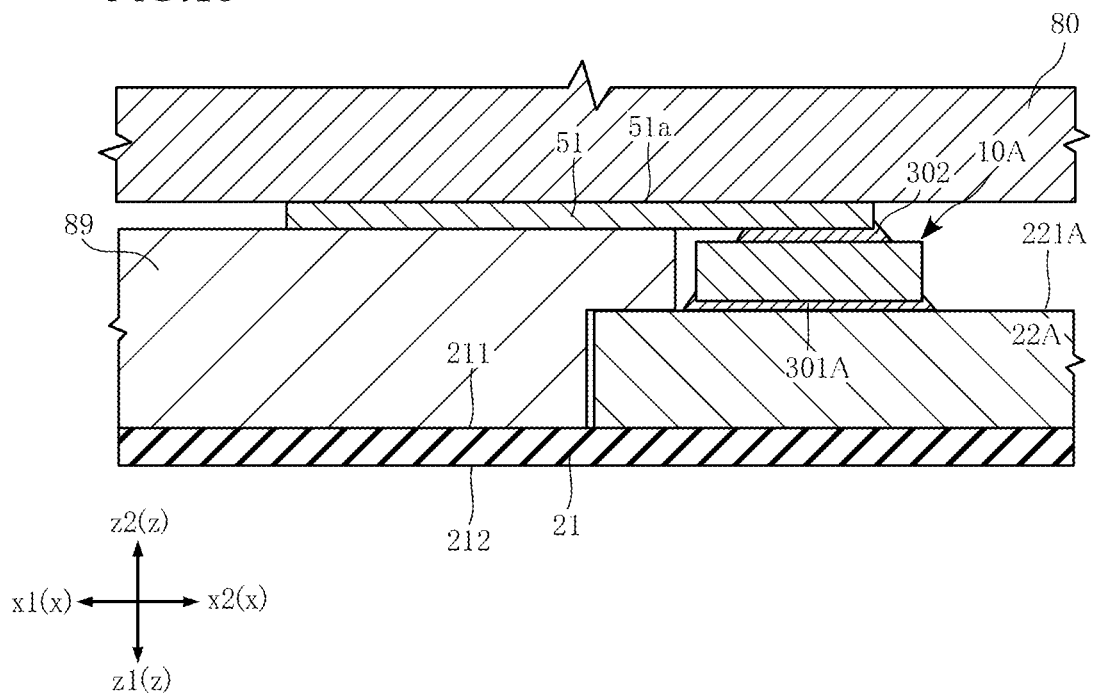
FIG. 15 is a cross-sectional view for explaining a first press-heating process, in another manufacturing method of the semiconductor device according to the first embodiment.

The foregoing manufacturing method of the semiconductor device A1 does not depend on a specific jig. However, a jig may be employed in the manufacturing process of the semiconductor device A1. With the jig, the manufacturing method may be arranged, for example, as follows. The first sinterable metal material forming process, the first drying process, the first mounting process, and the second sinterable metal material forming process are performed, without the conductive substrate 22B having been bonded to the insulation substrate 21, in the support substrate preparation process. Then a jig 89 is placed at the position where the conductive substrate 22B is to be mounted, as shown in FIG. 15. The jig 89 is larger than the region where the conductive substrate 22B is to be located and, as shown in FIG. 15 covers a part of the obverse face 221A of the conductive substrate 22A. Thereafter, in the lead connecting process, the lead members 51 are placed so as to bridge between the semiconductor elements 10A and the jig 89. Then the first pressure-heating is performed, to bond the semiconductor elements 10A to the conductive substrate 22A, and to one end portion of the lead members 51. The jig 89 is then removed, and the conductive substrate 22B is bonded onto the insulation substrate 21, after which the lead bonding process is performed to bond the other end portion of the lead members 51 to the conductive substrate 22B. The processes to be performed thereafter are the same as the manufacturing method of the semiconductor device A1 according to the first embodiment. The mentioned process with the jig minimizes the space under the central portion of the lead members 51 in the width direction x, thereby preventing the lead members 51 from being bent by the pressing force of the pressurizing member 80.

Although the first pressure-heating process and the second pressure-heating process are separately performed in the foregoing manufacturing method of the semiconductor device A1, the present disclosure is not limited to the above. For example, the first pressure-heating process and the second pressure-heating process can be performed at a time, by changing the order of the processes of the manufacturing method. The manufacturing method may be performed in the following order: the support substrate preparation process, the first sinterable metal material forming process and the third sinterable metal material forming process, the first drying process and the second drying process, the first mounting process and the second mounting process, the second sinterable metal material forming process and the fourth sinterable metal material forming process, the lead connecting process, the block electrode mounting process, the first pressure-heating process and the second pressure-heating process, the lead bonding process, the terminal bonding process, the wire forming process, the resin forming process, and the post-processing. Such an arrangement allows the first pressure-heating process and the second pressure-heating process to be performed at the same time, thereby improving the productivity of the semiconductor device A1. Further, the mentioned manufacturing method also allows the first drying process and the second drying process to be performed at the same time, thereby further improving the productivity.

Semiconductor devices according to variations of the first embodiment will be described below.

Figure 16:
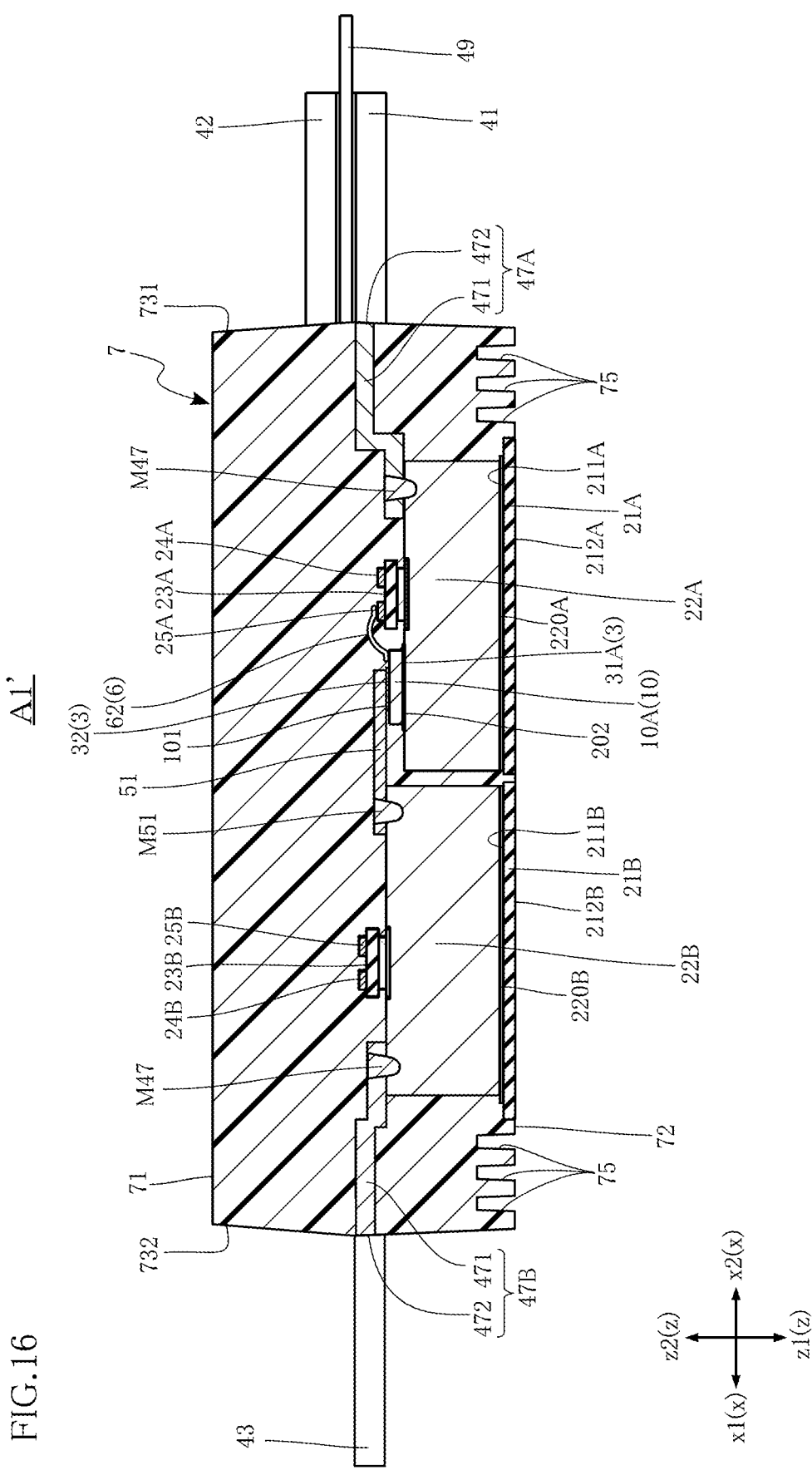
FIG. 16 is a cross-sectional view showing a semiconductor device according to a variation of the first embodiment.

Although the support substrate 20 includes a single insulation substrate 21, and the insulation substrate 21 supports the conductive substrates 22A and 22B in the first embodiment, the present disclosure is not limited to the mentioned configuration. For example, the support substrate 20 may include two insulation substrates 21A and 21B, so that the insulation substrate 21A may support the conductive substrate 22A, and the insulation substrate 21B may support the conductive substrate 22B. FIG. 16 illustrates a semiconductor device A1' configured according to such a variation.

In the semiconductor device A1', as shown in FIG. 16, the conductive substrate 22A is bonded to the insulation substrate 21A via the bonding material 220A. The insulation substrate 21A includes the obverse face 211A facing to the z2-side in the thickness direction, and the conductive substrate 22A is located on the obverse face 211A. Likewise, the conductive substrate 22B is bonded to the insulation substrate 21B via the bonding material 220B. The insulation substrate 21B includes the obverse face 211B facing to the z2-side in the thickness direction, and the conductive substrate 22B is located on the obverse face 211B. In this case, the combination of the insulation substrates 21A and 21B corresponds to the "insulation member" in the present disclosure, and the combination of the obverse faces 211A and 211B corresponds to the "insulation member obverse face" in the present disclosure.

The semiconductor device A1' can also prevent the degradation in reliability, like the semiconductor device A1.

Figure 17:
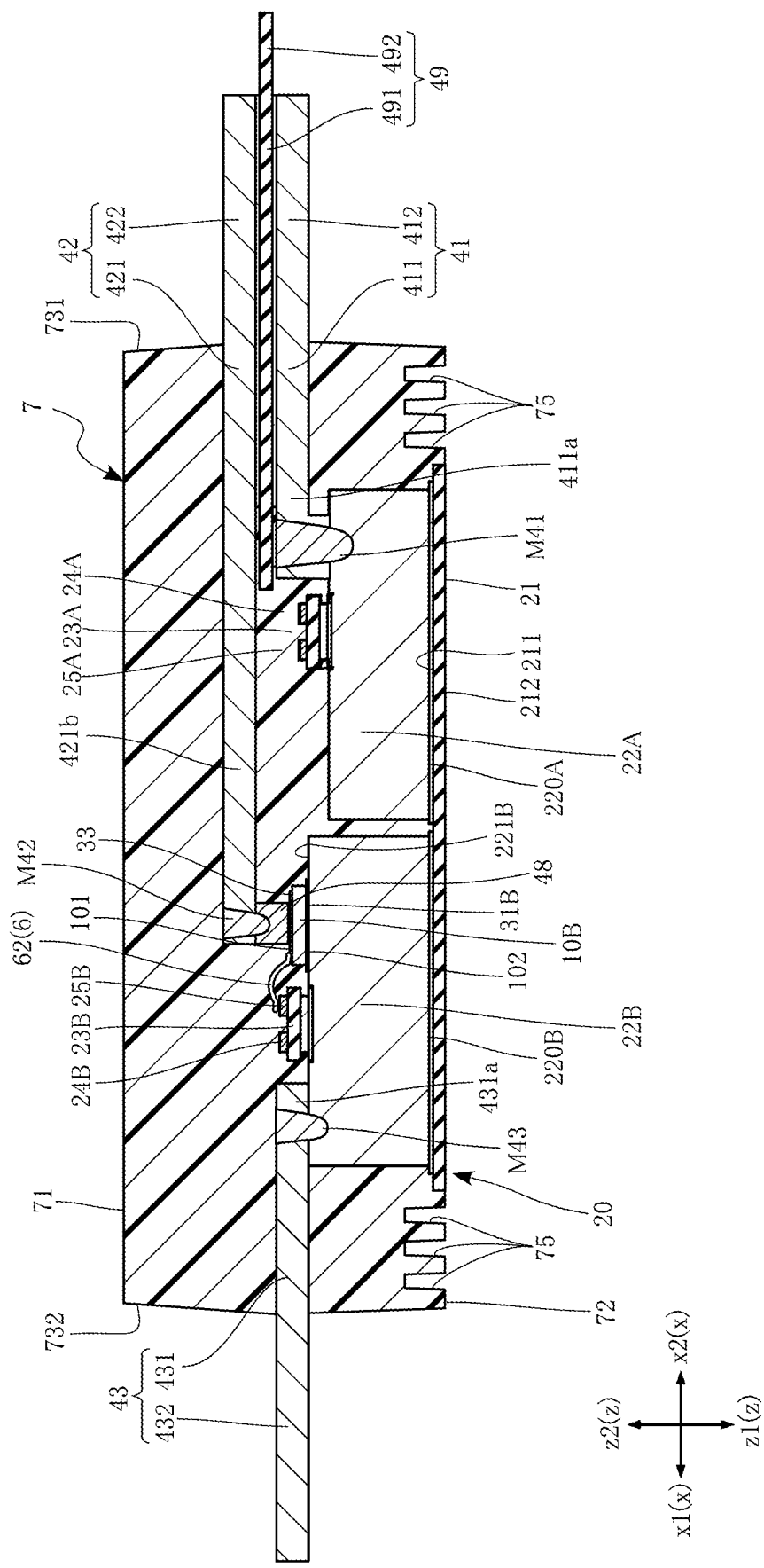
FIG. 17 is a cross-sectional view showing a semiconductor device according to another variation of the first embodiment.
Figure 18:
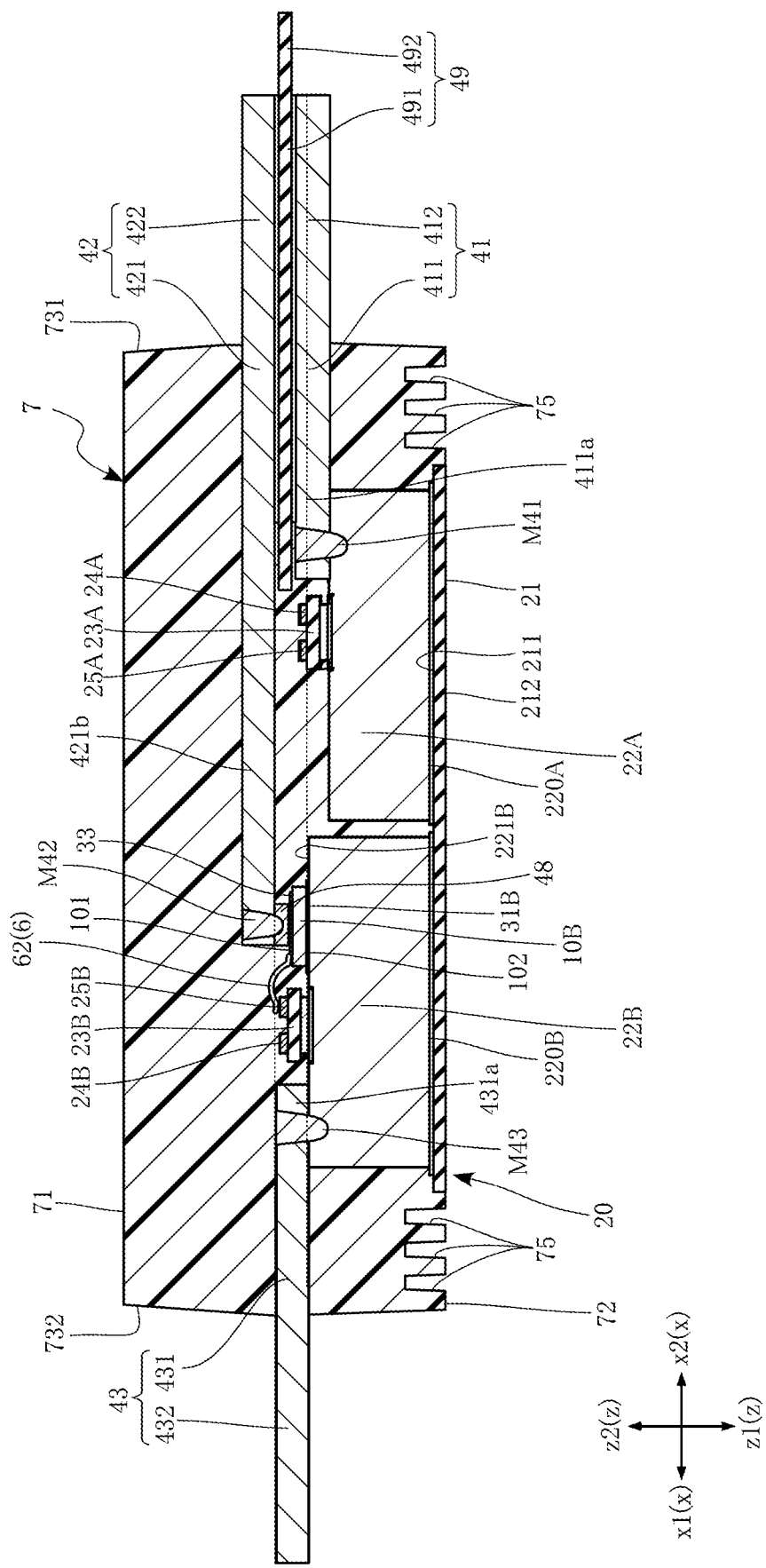
FIG. 18 is a cross-sectional view showing a semiconductor device according to another variation of the first embodiment.

Although the pad portion 411 (combtooth portions 411*a*) of the input terminal 41 is bent in the first embodiment, the present disclosure is not limited to the mentioned configuration. For example, as shown in FIG. 17, the respective end portions of the combtooth portions 411*a* may be made thicker, so as to protrude to the z1-side in the thickness direction. Alternatively, as shown in FIG. 18, the input terminal 42 may be formed in a flat plate shape, and the input terminal 41, the insulation plate 49, and the input terminal 42 may be shifted to the z1-side in the thickness direction compared with the first embodiment, by a distance corresponding to the level difference.

Figure 19:
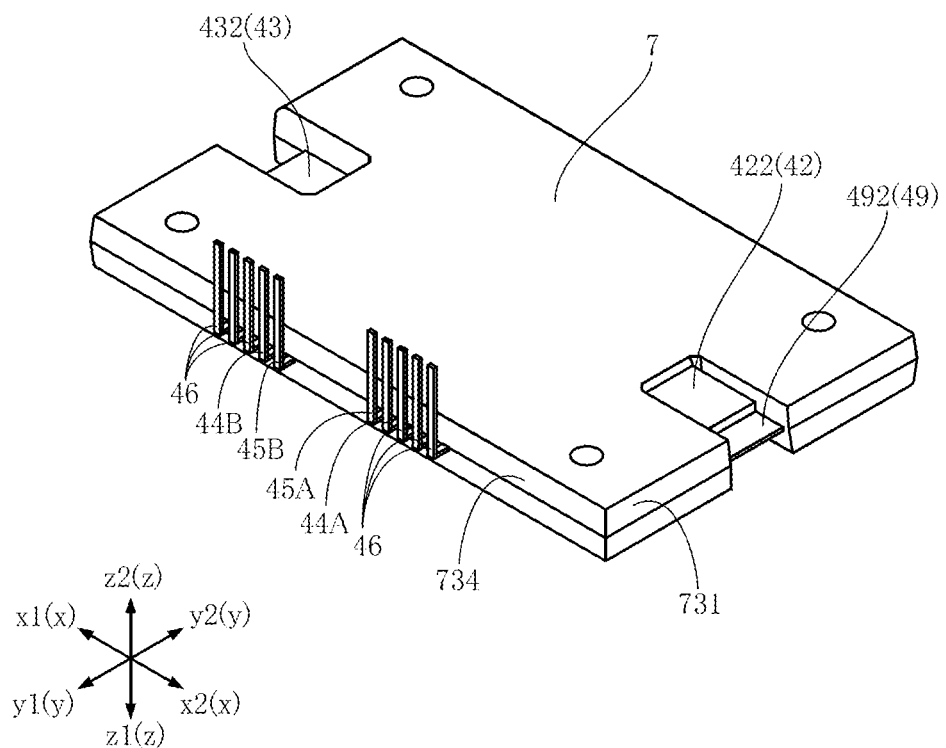
FIG. 19 is a perspective view showing a semiconductor device according to another variation of the first embodiment.

In the first embodiment, the shape of the sealing resin 7 is not limited to the above. FIG. 19 is a perspective view showing a semiconductor device according to another variation, in which the shape of the sealing resin 7 is different.

In the sealing resin 7 shown in FIG. 19, the respective edges in the depth direction y are extended in the width direction x, in a plan view. The portion of the sealing resin 7 extended to the x2-side in the width direction covers a part of each of the two input terminals 41 and 42 and a part of the insulation plate 49. In addition, the portion of the sealing resin 7 extended to the x1-side in the width direction covers a part of the output terminal 43. Such a configuration according to this variation can protect the respective portions of the two input terminals 41 and 42, the output terminal 43, and the insulation plate 49 protruding from the sealing resin 7, in the semiconductor device A1.

Semiconductor devices according to other embodiments will be described below. In the following description, the elements same as or similar to those of the first embodiment are given the same numeral, and the description thereof will not be repeated.

Second Embodiment

Figure 20:
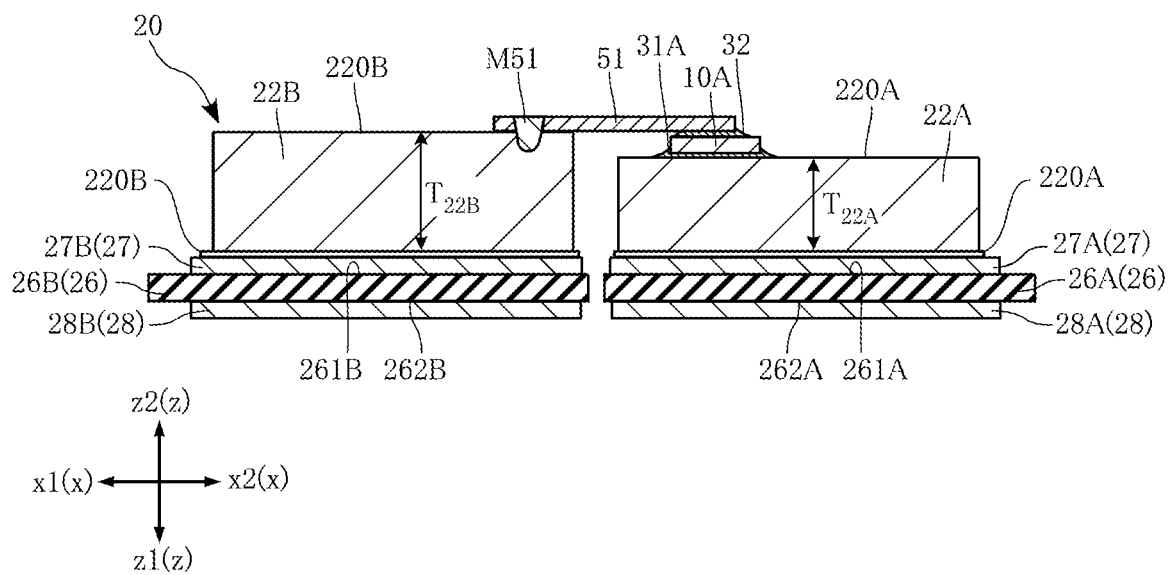
FIG. 20 is a cross-sectional view showing an essential part of a semiconductor device according to a second embodiment.

FIG. 20 illustrates a semiconductor device according to a second embodiment. FIG. 20 is a cross-sectional view showing the semiconductor device A2 according to the second embodiment, corresponding to the cross-sectional view of FIG. 10 representing the first embodiment. In FIG. 20, the parts other than a part of the support substrate 20, the semiconductor element 10A, a part of the conductive bonding layer 3, and the lead member 51 are omitted. The omitted parts are configured generally in the same way as the first embodiment, or the variations thereof. The semiconductor device A2 is different from the first embodiment, in the configuration of the support substrate 20. More specifically, the conductive substrates 22A and 22B are supported by a structure known as a direct-bonded copper (DBC) substrate, instead of the insulation substrate 21. Although the DBC substrate is employed in this embodiment, for example a direct-bonded aluminum (DBA) substrate may be employed instead.

In the support substrate 20 according to this embodiment, the conductive substrates 22A and 22B are supported by the structure known as the DBC substrate, as mentioned above. More specifically, the support substrate 20 includes an insulation substrate 26, an obverse face metal layer 27, a reverse face metal layer 28, and the conductive substrates 22A and 22B.

The insulation substrate 26 is electrically insulative. The insulation substrate 26 is formed of a ceramic, like the insulation substrate 21. However, the insulation substrate 26 may be formed of an insulative resin sheet or the like, without limitation to the ceramic. The insulation substrate 26 includes insulation substrates 26A and 26B, located apart from each other.

The insulation substrate 26A includes an obverse face 261A and a reverse face 262A spaced from each other and facing in opposite directions, in the thickness direction z. The obverse face 261A faces in the same direction as the element obverse face 101 of the semiconductor element 10A. The insulation substrate 26B includes an obverse face 261B and a reverse face 262B spaced from each other and facing in opposite directions, in the thickness direction z. The obverse face 261B faces in the same direction as the element obverse face 261A of the insulation substrate 26A. The insulation substrate 26A and the insulation substrate 26B have generally the same thickness. The insulation substrate 26A corresponds to the "first insulation substrate" in the present disclosure, and the insulation substrate 26B corresponds to the "second insulation substrate" in the present disclosure. In this embodiment, the combination of the reverse face 262A of the insulation substrate 26A and the reverse face 262B of the insulation substrate 26B corresponds to the "insulation substrate reverse face" in the present disclosure.

The obverse face metal layer 27 is formed so as to cover a part of the insulation substrate 26. The obverse face metal layer 27 is formed of copper. In the case where the DBA substrate is employed, the obverse face metal layer 27 is formed of aluminum. The obverse face metal layer 27 is covered with the sealing resin 7. The size of the obverse face metal layer 27 in the thickness direction z is approximately 200 to 400 μm. The obverse face metal layer 27 includes obverse face metal layers 27A and 27B, located apart from each other.

The obverse face metal layer 27A is formed on the obverse face 261A of the insulation substrate 26A. To the obverse face metal layer 27A, the conductive substrate 22A is bonded via the bonding material 220A. The obverse face metal layer 27B is formed on the obverse face 261B of the insulation substrate 26B. To the obverse face metal layer 27B, the conductive substrate 22B is bonded via the bonding material 220B. The obverse face metal layer 27A and the obverse face metal layer 27B have generally the same thickness. In this embodiment, the obverse face metal layer 27A corresponds to the "first obverse face metal layer" in the present disclosure, and the obverse face metal layer 27B corresponds to the "second obverse face metal layer" in the present disclosure.

The reverse face metal layer 28 is formed so as to cover at least a part of the reverse face 262 of the insulation substrate 26. The reverse face metal layer 28 is formed of copper. In the case where the DBA substrate is employed, the reverse face metal layer 28 is formed of aluminum. The reverse face metal layer 28 may be covered with the sealing resin 7, or have its face facing to the z1-side in the thickness direction exposed from the sealing resin 7. The size of the reverse face metal layer 28 in the thickness direction z is approximately 200 to 400 μm. The reverse face metal layer 28 includes reverse face metal layers 28A and 28B.

The reverse face metal layer 28A covers at least a part of the reverse face 262A of the insulation substrate 26A. The reverse face metal layer 28B covers at least a part of the reverse face 262B of the insulation substrate 26B. The reverse face metal layer 28A and the reverse face metal layer 28B have generally the same thickness. The thickness of the reverse face metal layer 28A may be the same as, or different from, that of the obverse face metal layer 27A. Likewise, the thickness of the reverse face metal layer 28B may be the same as, or different from, that of the obverse face metal layer 27B.

In the semiconductor device A2, the insulation substrate 26A, the obverse face metal layer 27A, and the reverse face metal layer 28A constitute one DBC substrate. Likewise, the insulation substrate 26B, the obverse face metal layer 27B, and the reverse face metal layer 28B constitute one DBC substrate.

In the semiconductor device A2, the insulation substrates 26A and 26B have the same thickness, and are located generally at the same position in the thickness direction z. The insulation substrates 26A and 26B overlap with each other, as viewed in the width direction x. The obverse face metal layers 27A and 27B have the same thickness, and are located generally at the same position in the thickness direction z. The obverse face metal layers 27A and 27B overlap with each other, as viewed in the width direction x. The reverse face metal layers 28A and 28B have the same thickness, and are located generally at the same position in the thickness direction z. The reverse face metal layers 28A and 28B overlap with each other, as viewed in the width direction x. The conductive substrates 22A and 22B have different thicknesses, as in the first embodiment, and the difference is approximately 100 to 500 μm. In this embodiment, therefore, the conductive substrates 22A and 22B, which have different thicknesses, are mounted on the respective DBC substrates, which have the same thickness, so that a level difference is created on the support substrate 20, because of the difference in thickness between the conductive substrates 22A and 22B.

In the semiconductor device A2, the semiconductor elements 10A bonded on the conductive substrate 22A and the conductive substrate 22B are electrically connected to each other, via the lead members 51. In addition, the conductive substrate 22A, the semiconductor elements 10A, and the lead bonding layers 32 overlap with the conductive substrate 22B, as viewed in the width direction x. In the semiconductor device A2, therefore, a level difference can be created between the face on which the semiconductor element 10A is mounted (obverse face 221A of the conductive substrate 22A) and the face on which the second bonding portion 512 of the lead member 51 is bonded (obverse face 221B of the conductive substrate 22B), as in the semiconductor device A1. Accordingly, for example, the lead members 51 can be formed in a flat plate shape without a bent portion. Such a configuration facilitates the lead members 51 to be uniformly pressed, thereby preventing the pressing force from becoming uneven. Consequently, the breakdown of the semiconductor element 10A, and the lack of strength of the conductive bonding layer 3 can be prevented. As result, degradation in reliability of the semiconductor device A2 can be prevented.

Figure 21:
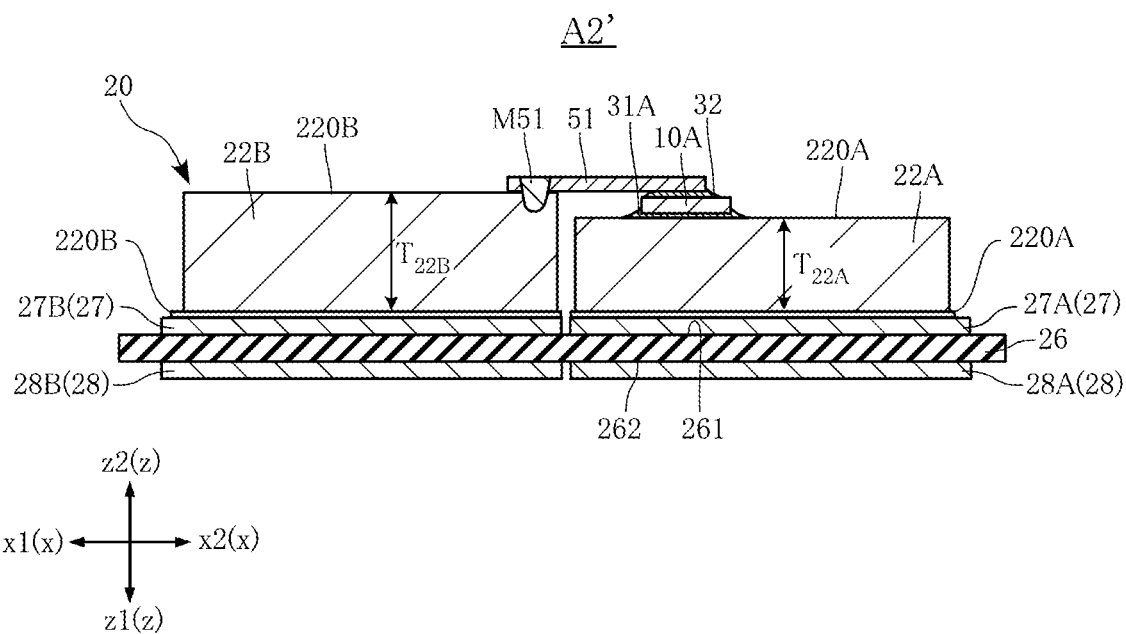
FIG. 21 is a cross-sectional view showing an essential part of a semiconductor device according to a variation of the second embodiment.

Although the insulation substrate 26 includes two insulation substrates 26A and 26B in the second embodiment, the present disclosure is not limited to the mentioned configuration. For example, as shown in FIG. 21, the insulation substrate 26A and the insulation substrate 26B may be unified. In other words, the support substrate 20 may include a single piece of insulation substrate 26, and the obverse face metal layers 27A and 27B may be formed on the obverse face 261 of the insulation substrate 26. The obverse face metal layers 27A and 27B can be formed, for example, by patterning one obverse face metal layer 27 formed on the obverse face 261 of the insulation substrate 26, in the DBC substrate. The patterning method is not specifically limited but, for example, an etching process may be employed. Here, when the insulation substrate 26A and the insulation substrate 26B are unified, the reverse face metal layer 28A and the reverse face metal layer 28B, formed on the reverse face 262 of the insulation substrate 26, may also be unified. In this variation, the reverse face 262 of the insulation substrate 26 corresponds to the "insulation substrate reverse face" in the present disclosure.

Third Embodiment

Figure 22:
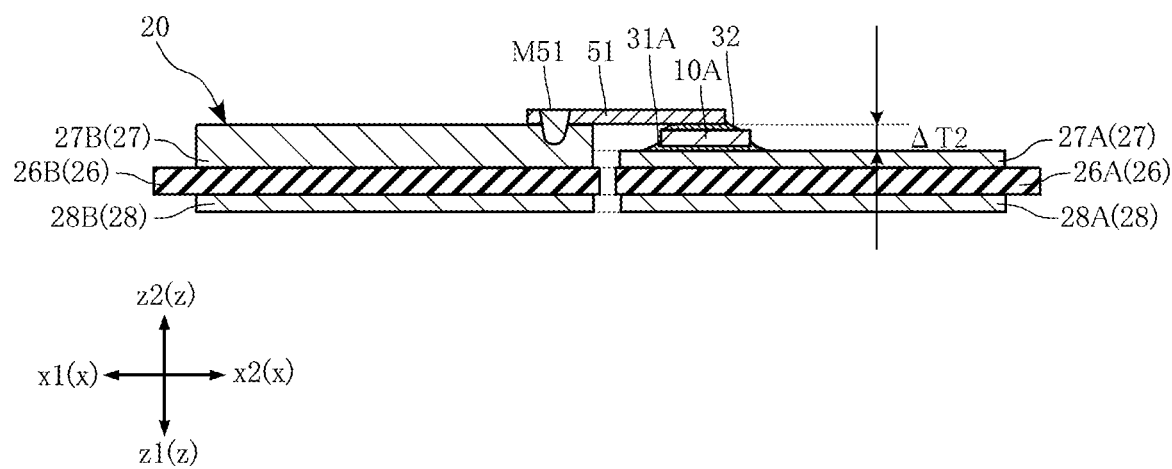
FIG. 22 is a cross-sectional view showing an essential part of a semiconductor device according to a third embodiment.

FIG. 22 illustrates a semiconductor device according to a third embodiment. FIG. 22 is a cross-sectional view showing the semiconductor device A3 according to the third embodiment, corresponding to the cross-sectional view of FIG. 20 representing the second embodiment. Accordingly, in FIG. 22 also, the parts other than a part of the support substrate 20, the semiconductor element 10A, a part of the conductive bonding layer 3, and the lead member 51 are omitted. The semiconductor device A3 is different from the first and second embodiments, in the configuration of the support substrate 20. More specifically, the semiconductor device A3 is different from the second embodiment in that the conductive substrates 22A and 22B are excluded, and that the obverse face metal layer 27A and the obverse face metal layer 27B have different thicknesses, in the obverse face metal layer 27.

The support substrate 20 according to this embodiment includes the insulation substrates 26A and 26B, the obverse face metal layers 27A and 27B, and the reverse face metal layers 28A and 28B.

To the obverse face metal layer 27A according to this embodiment, the plurality of semiconductor elements 10A are conductively bonded via the element bonding layer 31A. The obverse face metal layer 27A is electrically connected to the respective reverse face electrodes 12 (drain electrodes) of the semiconductor elements 10A. In addition, a non-illustrated P-terminal (corresponding to input terminal 41) is connected to the obverse face metal layer 27A, and the P-terminal is partially exposed from the sealing resin 7. In this embodiment, the obverse face metal layer 27A corresponds to the "first electrode member" in the present disclosure.

To the obverse face metal layer 27B according to this embodiment, the plurality of lead members 51 are bonded by laser welding. The obverse face metal layer 27B is electrically connected to the first electrodes 111 (source electrodes) of the obverse face electrode 11 of each of the semiconductor elements 10A, via the lead member 51. In addition, the plurality of semiconductor elements 10B are conductively bonded to the obverse face metal layer 27B via the element bonding layer 31B. The obverse face metal layer 27B is electrically connected to the respective reverse face electrodes 12 (drain electrodes) of the semiconductor elements 10B. A non-illustrated output terminal (corresponding to output terminal 43) is connected to the obverse face metal layer 27B, and the output terminal is partially exposed from the sealing resin 7. In this embodiment, the obverse face metal layer 27B corresponds to the "second electrode member" in the present disclosure.

In the semiconductor device A3, the obverse face metal layer 27A is thinner than the obverse face metal layer 27B. The difference in thickness ΔT2 (see FIG. 22) is approximately 100 to 500 μm. In addition, the semiconductor elements 10A, the obverse face metal layer 27A, and the lead bonding layers 32 overlap with the obverse face metal layer 27B as viewed in the width direction x. In this embodiment, a level difference is created on the support substrate 20, by thus forming the obverse face metal layers 27A and 27B in different thicknesses.

In the semiconductor device A3, the semiconductor elements 10A bonded on the obverse face metal layer 27A of the obverse face metal layer 27 are electrically connected to the obverse face metal layer 27B of the obverse face metal layer 27, via the lead members 51. In addition, the obverse face metal layer 27A of the obverse face metal layer 27, the semiconductor elements 10A, and the lead bonding layers 32 overlap with the obverse face metal layer 27B of the obverse face metal layer 27, as viewed in the width direction x. In the semiconductor device A3, therefore, a level difference can be created between the face on which the semiconductor element 10A is mounted and the face on which the second bonding portion 512 of the lead member 51 is bonded, as in the semiconductor device A1. It is to be noted that, in this embodiment, the face on which the semiconductor element 10A is mounted is the face of the obverse face metal layer 27A facing to the z2-side in the thickness direction, and the face on which the second bonding portion 512 of the lead member 51 is bonded is the face of the obverse face metal layer 27B facing to the z2-side in the thickness direction. Accordingly, for example, the lead members 51 can be formed in a flat plate shape without a bent portion. Such a configuration facilitates the lead members 51 to be uniformly pressed, thereby preventing the pressing force from becoming uneven. Consequently, the breakdown of the semiconductor element 10A, and the lack of strength of the conductive bonding layer 3 can be prevented. As result, degradation in reliability of the semiconductor device A3 can be prevented.

Although the conductive substrates 22A and 22B are excluded in the third embodiment, the semiconductor device A3 may include these substrates. FIG. 23 illustrates a semiconductor device A3' according to such a variation. In the semiconductor device A3', the conductive substrate 22A is formed on the obverse face metal layer 27A, and the conductive substrate 22B is formed on the obverse face metal layer 27B, as in the second embodiment. In this variation, the conductive substrate 22A and the conductive substrate 22B have the same thickness.

In the third embodiment and the variation thereof, the insulation substrate 26A and the insulation substrate 26B may be unified, as in the semiconductor device A2'. When the insulation substrate 26A and the insulation substrate 26B are unified, the reverse face metal layer 28A and the reverse face metal layer 28B may also be unified.

Fourth Embodiment

FIG. 24 illustrates a semiconductor device according to a fourth embodiment. FIG. 24 is a cross-sectional view showing the semiconductor device A4 according to the fourth embodiment, corresponding to the cross-sectional view of FIG. 20 representing the second embodiment. Accordingly, in FIG. 24 also, the parts other than a part of the support substrate 20, the semiconductor element 10A, a part of the conductive bonding layer 3, and the lead member 51 are omitted. The semiconductor device A4 is different from the first to the third embodiments, in the configuration of the support substrate 20. More specifically, the semiconductor device A4 is different from the third embodiment in that, not only the obverse face metal layers 27A and 27B of the obverse face metal layer 27, but also the reverse face metal layers 28A and 28B of the reverse face metal layer 28 have different thicknesses.

In this embodiment, the obverse face metal layer 27A and the reverse face metal layer 28A have generally the same thickness, and also the obverse face metal layer 27B and the reverse face metal layer 28B have generally the same thickness. However, the thickness of the obverse face metal layer 27A and the reverse face metal layer 28A, and the thickness of the obverse face metal layer 27B and the reverse face metal layer 28B are different from each other. In this embodiment, as shown in FIG. 24, the obverse face metal layer 27B and the reverse face metal layer 28B are thicker than the obverse face metal layer 27A and the reverse face metal layer 28A. Thus, a level difference is created on the support substrate 20. The level difference is approximately 100 to 500 μm. In this embodiment, the obverse face metal layer 27A corresponds to the "first electrode member" in the present disclosure, and the obverse face metal layer 27B corresponds to the "second electrode member" in the present disclosure.

In the semiconductor device A4, the semiconductor elements 10A bonded on the obverse face metal layer 27A of the obverse face metal layer 27 are electrically connected to the obverse face metal layer 27B of the obverse face metal layer 27, via the lead members 51. In addition, a part of the obverse face metal layer 27A of the obverse face metal layer 27, the semiconductor elements 10A, and the lead bonding layers 32 overlap with the obverse face metal layer 27B of the obverse face metal layer 27, as viewed in the width direction x. In the semiconductor device A4, therefore, a level difference can be created between the face on which the semiconductor element 10A is mounted (face of the obverse face metal layer 27A facing to the z2-side in the thickness direction) and the face on which the second bonding portion 512 of the lead member 51 is bonded (face of the obverse face metal layer 27B facing to the z2-side in the thickness direction), as in the semiconductor device A3. Accordingly, for example, the lead members 51 can be formed in a flat plate shape without a bent portion. Such a configuration facilitates the lead members 51 to be uniformly pressed, thereby preventing the pressing force from becoming uneven. Consequently, the breakdown of the semiconductor element 10A, and the lack of strength of the conductive bonding layer 3 can be prevented. As result, degradation in reliability of the semiconductor device A4 can be prevented.

Although the conductive substrates 22A and 22B are excluded in the fourth embodiment, the semiconductor device A4 may include these substrates. FIG. 25 illustrates a semiconductor device A4' according to such a variation. In the semiconductor device A4', the conductive substrate 22A is formed on the obverse face metal layer 27A, and the conductive substrate 22B is formed on the obverse face metal layer 27B, as in the second embodiment. In this variation, the conductive substrate 22A and the conductive substrate 22B have the same thickness. In this variation, the conductive substrate 22A corresponds to the "first electrode member" in the present disclosure, and the conductive substrate 22B corresponds to the "second electrode member" in the present disclosure.

Fifth Embodiment

FIG. 26 illustrates a semiconductor device according to a fifth embodiment. FIG. 26 is a cross-sectional view showing the semiconductor device A5 according to the fifth embodiment, corresponding to the cross-sectional view of FIG. 20 representing the second embodiment. Accordingly, in FIG. 26 also, the parts other than a part of the support substrate 20, the semiconductor element 10A, a part of the conductive bonding layer 3, and the lead member 51 are omitted. The semiconductor device A5 is different from the first to the fourth embodiments, in the configuration of the support substrate 20. More specifically, in the semiconductor device A5, the conductive substrates 22A and 22B have generally the same thickness, the conductive substrate 22A being supported by the insulation substrate 21, and the conductive substrate 22B being supported by the DBC substrate.

In this embodiment, the conductive substrate 22A is bonded to the insulation substrate 21 via the bonding material 220A. The conductive substrate 22B is bonded to the DBC substrate, including the obverse face metal layer 27 (obverse face metal layer 27B), the insulation substrate 26, and the reverse face metal layer 28 (reverse face metal layer 28B) from the top, via the bonding material 220B. Because of such a configuration, a level difference is created on the support substrate 20. The level difference is approximately 100 to 500 μm. In this embodiment, the conductive substrate 22A corresponds to the "first electrode member" in the present disclosure, and the conductive substrate 22B corresponds to the "second electrode member" in the present disclosure.

In the semiconductor device A5, the semiconductor elements 10A bonded on the conductive substrate 22A and the conductive substrate 22B are electrically connected to each other, via the lead members 51. In addition, the conductive substrate 22A, the semiconductor elements 10A, and the lead bonding layers 32 overlap with the conductive substrate 22B, as viewed in the width direction x. In the semiconductor device A5, therefore, a level difference can be created between the face on which the semiconductor element 10A is mounted (obverse face 221A of the conductive substrate 22A) and the face on which the second bonding portion 512 of the lead member 51 is bonded (obverse face 221B of the conductive substrate 22B), as in the semiconductor device A1. Accordingly, for example, the lead members 51 can be formed in a flat plate shape without a bent portion. Such a configuration facilitates the lead members 51 to be uniformly pressed, thereby preventing the pressing force from becoming uneven. Consequently, the breakdown of the semiconductor element 10A, and the lack of strength of the conductive bonding layer 3 can be prevented. As result, degradation in reliability of the semiconductor device A5 can be prevented.

Sixth Embodiment

Figure 27:
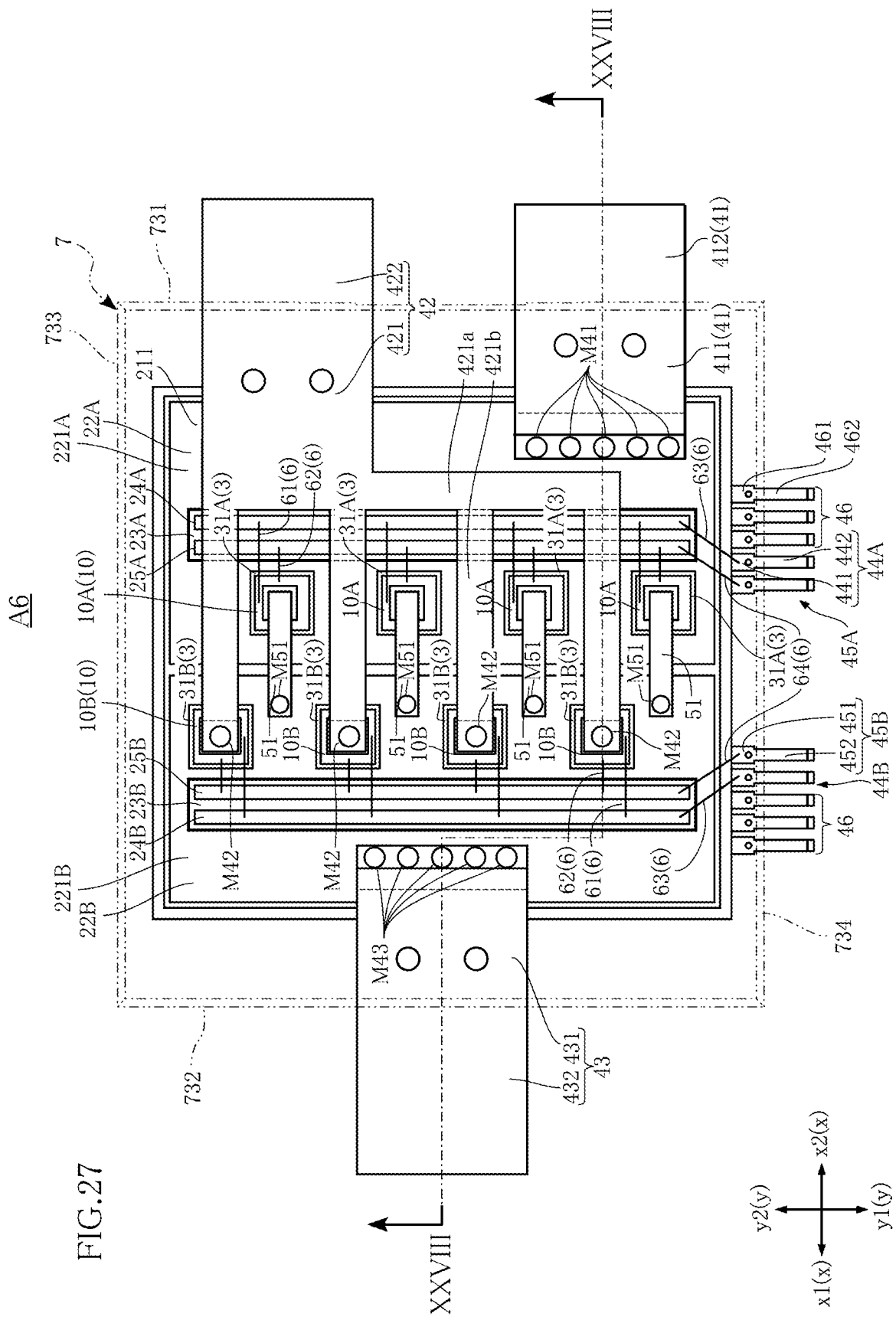
FIG. 27 is a plan view showing a semiconductor device according to a sixth embodiment, seen through a sealing resin.
Figure 28:
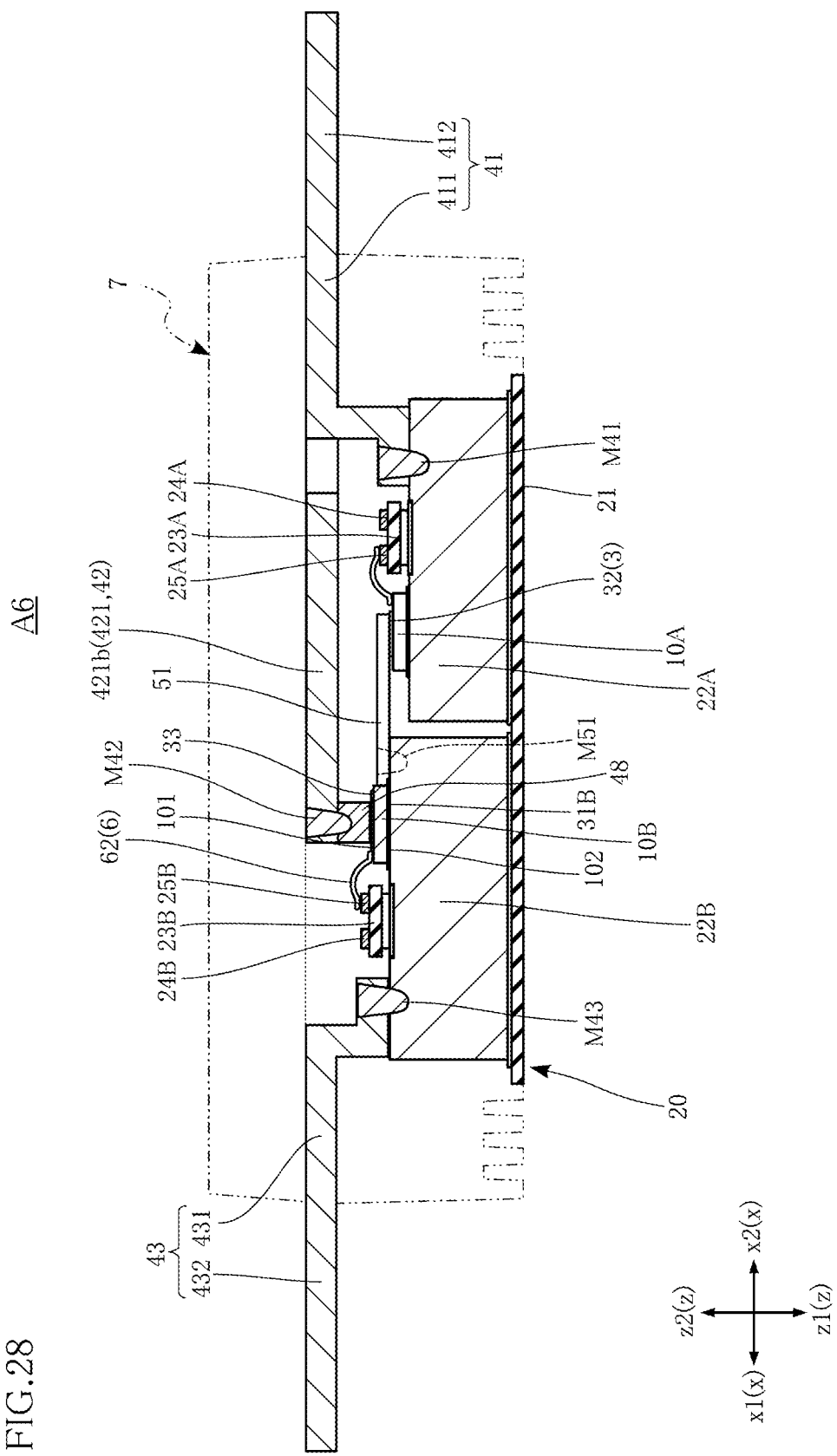
FIG. 28 is a cross-sectional view taken along a line XXVIII-XXVIII in FIG. 27.

FIG. 27 and FIG. 28 illustrate a semiconductor device according to a sixth embodiment. FIG. 27 is a plan view showing the semiconductor device A6 according to the sixth embodiment, in which the sealing resin 7 is indicated by imaginary lines (dash-dot-dot lines). FIG. 28 is a cross-sectional view taken along a line XXVIII-XXVIII in FIG. 27. The semiconductor device A6 is different from the first embodiment in the shape and the location of the input terminals 41 and 42, and the output terminal 43.

In the input terminal 41 according to this embodiment, the terminal portion 412 is located at generally the same position in the thickness direction z, as the input terminal 42 and a part of the output terminal 43 (part of pad portion 431, and terminal portion 432). Accordingly, as shown in FIG. 28, a part of the pad portion 411 of the input terminal 41 is bent in the thickness direction z. In the input terminal 41, in addition, a part of the pad portion 411 and the terminal portion 412 overlap with a part of the input terminal 42 as viewed in the depth direction y, as shown in FIG. 28. Here, although the pad portion 411 is without the combtooth portion 411a in this embodiment, the pad portion 411 may include the combtooth portion 411a, as in the first embodiment.

In the output terminal 43 according to this embodiment, the terminal portion 432 is located at generally the same position in the thickness direction z, as the input terminal 42 and a part of the input terminal 41. Accordingly, as shown in FIG. 28, a part of the pad portion 431 of the output terminal 43 is bent in the thickness direction z. Here, although the pad portion 431 is without the combtooth portion 431a in this embodiment, the pad portion 431 may include the combtooth portion 431a, as in the first embodiment.

The semiconductor device A6 is configured substantially in the same way as the semiconductor device A1, except for the shape and location of the input terminals 41 and 42, and the output terminal 43. Therefore, degradation in reliability of the semiconductor device A6 can be prevented, as in the case of the semiconductor device A1.

Although the semiconductor devices according to the first to sixth embodiments include the plurality of semiconductor elements 10, the present disclosure is not limited to such a configuration. For example, the semiconductor device according to the present disclosure may include a single piece of semiconductor element 10. Therefore, the semiconductor device according to the present disclosure is not limited to a multi-functional semiconductor device, but may be a monofunctional semiconductor device.

The semiconductor device and the manufacturing method thereof according to the present disclosure are not limited to the foregoing embodiments. The specific configuration of the elements of the semiconductor device according to the present disclosure, and the specific works to be performed in the manufacturing process of the semiconductor device according to the present disclosure may be modified in various manners.

Appendix 1.

A semiconductor device comprising:

a semiconductor element having an element obverse face and an element reverse face that face mutually oppositely in a first direction, the element obverse face being formed with an obverse face electrode, the element reverse face being formed with a reverse face electrode;

a first electrode member including a first obverse face opposing the element reverse face and conductively bonded to the reverse face electrode;

a second electrode member including a second obverse face facing in a same direction as the first obverse face, the second electrode member being spaced apart from the first electrode member in a second direction orthogonal to the first direction; and a connecting member extending in the second direction and electrically connecting the obverse face electrode and the second electrode member, wherein the connecting member is located offset from the second obverse face in the direction in which the second obverse face faces, the connecting member being bonded to the obverse face electrode via a conductive bonding layer, and the first electrode member, the semiconductor element, and the conductive bonding layer overlap with the second electrode member, as viewed in the second direction.

Appendix 2.

The semiconductor device according to appendix 1, further comprising an insulation member having an insulation member obverse face facing in a same direction as the element obverse face, and the insulation member supporting the first electrode member and the second electrode member on a side of the insulation member to which the insulation member obverse face faces.

Appendix 3.

The semiconductor device according to appendix 2, wherein the first electrode member comprises a first conductive substrate bonded to the insulation member via a first bonding material, and the second electrode member comprises a second conductive substrate bonded to the insulation member via a second bonding material.

Appendix 4.

The semiconductor device according to appendix 2, further comprising a first obverse face metal layer and a second obverse face metal layer that are formed on the insulation member obverse face and spaced apart from each other, wherein the first electrode member comprises a first conductive substrate bonded to the first obverse face metal layer via a first bonding material, and the second electrode member comprises a second conductive substrate bonded to the second obverse face metal layer via a second bonding material.

Appendix 5.

The semiconductor device according to appendix 4, wherein the second conductive substrate is greater in size in the first direction than the first conductive substrate.

Appendix 6.

The semiconductor device according to any one of appendix 3 to appendix 5, wherein the first conductive substrate comprises one of a copper substrate or a composite substrate that includes a graphite substrate with a copper material provided on opposite faces of the graphite substrate in the first direction.

Appendix 7.

The semiconductor device according to any one of appendix 3 to appendix 6, wherein the second conductive substrate comprises one of a copper substrate or a composite substrate that includes a graphite substrate with a copper material provided on opposite faces of the graphite substrate in the first direction.

Appendix 8.

The semiconductor device according to appendix 2, wherein the first electrode member comprises a first obverse face metal layer formed on the insulation member obverse face, and the second electrode member comprises a second obverse face metal layer formed on the insulation member obverse face and spaced apart from the first obverse face metal layer.

Appendix 9.

The semiconductor device according to appendix 4 or appendix 8, wherein the second obverse face metal layer is greater in size in the first direction than the first obverse face metal layer.

Appendix 10.

The semiconductor device according to any one of appendix 3 to appendix 9, wherein the insulation member includes a first insulation substrate and a second insulation substrate spaced apart from each other, the first electrode member overlaps with the first insulation substrate as viewed in the first direction and is supported by the first insulation substrate, and the second electrode member overlaps with the second insulation substrate as viewed in the first direction and is supported by the second insulation substrate.

Appendix 11.

The semiconductor device according to appendix 10, wherein the first insulation substrate and the second insulation substrate overlap with each other, as viewed in the second direction.

Appendix 12.

The semiconductor device according to any one of appendix 2 to appendix 11, wherein the insulation member includes an insulation substrate reverse face facing in an opposite direction to the insulation member obverse face in the first direction, and the semiconductor device further comprises a reverse face metal layer formed on the insulation substrate reverse face.

Appendix 13.

The semiconductor device according to any one of appendix 1 to appendix 12, wherein the connecting member is attached to the second electrode member by laser welding.

Appendix 14.

The semiconductor device according to any one of appendix 1 to appendix 13, wherein the semiconductor element comprises a power MOSFET.

Appendix 15.

The semiconductor device according to any one of appendix 1 to appendix 14, wherein the conductive bonding layer comprises a sintered metal.

Appendix 16.

The semiconductor device according to any one of appendix 1 to appendix 15, further comprising a sealing resin covering the semiconductor element, the connecting member, the conductive bonding layer, the first electrode member and the second electrode member.

Appendix 17.

A manufacturing method of a semiconductor device, the semiconductor device comprising:

a semiconductor element having an element obverse face and an element reverse face facing mutually oppositely in a first direction, the element obverse face being formed with an obverse face electrode, the element reverse face being formed with a reverse face electrode;

a first electrode member including a first obverse face facing in a same direction as the element obverse face; and a second electrode member including a second obverse face facing in the same direction as the first obverse face, the second electrode member being spaced apart from the first electrode member in a second direction orthogonal to the first direction, the manufacturing method comprising:

mounting the semiconductor element on the first electrode member such that the element reverse face and the first obverse face oppose each other;

electrically connecting the obverse face electrode and a connecting member via a conductive bonding layer; and bonding the connecting member to the second electrode member, wherein the connecting member is located offset from the second obverse face in the direction in which the second obverse face faces, and at least a part of the first electrode member, the semiconductor element and the conductive bonding layer overlap with the second electrode member as viewed in the second direction.

The invention claimed is:

1. A semiconductor device comprising:
a semiconductor element having an element obverse face and an element reverse face that face mutually oppositely in a first direction, the element obverse face being formed with an obverse face electrode, the element reverse face being formed with a reverse face electrode;
a first electrode member including a first obverse face opposing the element reverse face and conductively bonded to the reverse face electrode;
a second electrode member including a second obverse face facing in a same direction as the first obverse face, the second electrode member being spaced apart from the first electrode member in a second direction orthogonal to the first direction;
a connecting member extending in the second direction and electrically connecting the obverse face electrode and the second electrode member; and
an insulation member having an insulation member obverse face facing in a same direction as the element obverse face, the insulation member supporting the first electrode member and the second electrode member on a side of the insulation member to which the insulation member obverse face faces,
wherein the connecting member is located offset from the second obverse face in the direction in which the second obverse face faces, the connecting member being bonded to the obverse face electrode via a conductive bonding layer, the first electrode member, the semiconductor element, and the conductive bonding layer overlap with the second electrode member, as viewed in the second direction, the first electrode member comprises a first conductive substrate bonded to the insulation member via a first bonding material, and the second electrode member comprises a second conductive substrate bonded to the insulation member via a second bonding material.

2. The semiconductor device according to claim 1, further comprising a first obverse face metal layer and a second obverse face metal layer that are formed on the insulation member obverse face and spaced apart from each other, wherein the first electrode member comprises a first conductive substrate bonded to the first obverse face metal layer via a first bonding material, and the second electrode member comprises a second conductive substrate bonded to the second obverse face metal layer via a second bonding material.

3. The semiconductor device according to claim 2, wherein the second conductive substrate is greater in size in the first direction than the first conductive substrate.

4. The semiconductor device according to claim 1, wherein the first conductive substrate comprises one of a copper substrate or a composite substrate that includes a graphite substrate with a copper material provided on opposite faces of the graphite substrate in the first direction.

5. The semiconductor device according to claim 1, wherein the second conductive substrate comprises one of a copper substrate or a composite substrate that includes a graphite substrate with a copper material provided on opposite faces of the graphite substrate in the first direction.

6. The semiconductor device according to claim 1, wherein the first electrode member comprises a first obverse face metal layer formed on the insulation member obverse face, and the second electrode member comprises a second obverse face metal layer formed on the insulation member obverse face and spaced apart from the first obverse face metal layer.

7. The semiconductor device according to claim 2, wherein the second obverse face metal layer is greater in size in the first direction than the first obverse face metal layer.

8. The semiconductor device according to claim 1, wherein the insulation member includes a first insulation substrate and a second insulation substrate spaced apart from each other, the first electrode member overlaps with the first insulation substrate as viewed in the first direction and is supported by the first insulation substrate, and the second electrode member overlaps with the second insulation substrate as viewed in the first direction and is supported by the second insulation substrate.

9. The semiconductor device according to claim 8, wherein the first insulation substrate and the second insulation substrate overlap with each other, as viewed in the second direction.

10. The semiconductor device according to claim 1, wherein the insulation member includes an insulation substrate reverse face facing in an opposite direction to the insulation member obverse face in the first direction, and the semiconductor device further comprises a reverse face metal layer formed on the insulation substrate reverse face.

11. The semiconductor device according to claim 1, wherein the connecting member protrudes into the second electrode member.

12. The semiconductor device according to claim 1, wherein the semiconductor element comprises a power MOSFET.

13. The semiconductor device according to claim 1, wherein the conductive bonding layer comprises a sintered metal.

14. The semiconductor device according to claim 1, further comprising a sealing resin covering the semiconductor element, the connecting member, the conductive bonding layer, the first electrode member and the second electrode member.

15. A manufacturing method of a semiconductor device, the semiconductor device comprising:

a semiconductor element having an element obverse face and an element reverse face facing mutually oppositely in a first direction, the element obverse face being formed with an obverse face electrode, the element reverse face being formed with a reverse face electrode;

a first electrode member including a first obverse face facing in a same direction as the element obverse face;

a second electrode member including a second obverse face facing in the same direction as the first obverse face, the second electrode member being spaced apart from the first electrode member in a second direction orthogonal to the first direction; and an insulation member having an insulation member obverse face facing in a same direction as the element obverse face, the insulation member supporting the first electrode member and the second electrode member on a side of the insulation member to which the insulation member obverse face faces, wherein the first electrode member comprises a first conductive substrate bonded to the insulation member via a first bonding material, and the second electrode member comprises a second conductive substrate bonded to the insulation member via a second bonding material, the manufacturing method comprising:

mounting the semiconductor element on the first electrode member such that the element reverse face and the first obverse face oppose each other;

electrically connecting the obverse face electrode and a connecting member via a conductive bonding layer; and bonding the connecting member to the second electrode member, wherein the connecting member is located offset from the second obverse face in the direction in which the second obverse face faces, and at least a part of the first electrode member, the semiconductor element and the conductive bonding layer overlap with the second electrode member as viewed in the second direction.

16. The semiconductor device according to claim 1, wherein the semiconductor element comprises a plurality of semiconductor elements connected in parallel with one another.

17. The semiconductor device according to claim 1, further comprising a second semiconductor element formed on the obverse face of the second electrode member and electrically connected to the semiconductor element to constitute a half-bridge switching circuit.

18. The semiconductor device according to claim 1, wherein the semiconductor element is made of a semiconductor material mainly composed of SiC.

19. The semiconductor device according to claim 1, further comprising:
   an insulation layer arranged on the obverse face of the first or second electrode member; and
   wiring layers formed on a surface of the insulation layer.

20. The semiconductor device according to claim 1, further comprising a gate electrode that is on the element obverse face and is not connected to the connecting member.

* * * * *